US012777922B2

(12) United States Patent
Muto et al.

(10) Patent No.: US 12,777,922 B2
(45) Date of Patent: Oct. 27, 2026

(54) POWER SUPPLY CIRCUIT MODULE

(71) Applicant: Murata Manufacturing Co., Ltd., Nagaokakyo (JP)

(72) Inventors: Takami Muto, Nagaokakyo (JP); Tsutomu Ishige, Nagaokakyo (JP); Takanari Okada, Nagaokakyo (JP); Hiroki Minami, Nagaokakyo (JP); Munetake Miyashita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 754 days.

(21) Appl. No.: 18/131,385

(22) Filed: Apr. 6, 2023

(65) Prior Publication Data

US 2023/0282569 A1 Sep. 7, 2023

Related U.S. Application Data

(63) Continuation of application No. PCT/JP2021/024397, filed on Jun. 28, 2021.

(30) Foreign Application Priority Data

Oct. 30, 2020 (JP) ................................ 2020-182955
Mar. 9, 2021 (JP) ................................ 2021-037422

(51) Int. Cl.

*H10W 20/40* (2026.01)
*H02M 3/158* (2006.01)
*H10W 72/20* (2026.01)

(52) U.S. Cl.

CPC ....... *H10W 20/496* (2026.01); *H10W 20/497* (2026.01); *H10W 72/20* (2026.01); *H02M 3/1584* (2013.01)

(58) Field of Classification Search

CPC . H01L 23/5227; H02M 3/003; H02M 3/1584; H01F 27/027

See application file for complete search history.

(56) References Cited

U.S. PATENT DOCUMENTS 6,373,714 B1 * 4/2002 Kudoh .................. H05K 1/141 361/736
2004/0051600 A1 * 3/2004 Begon .................. H03H 7/0115 333/185

(Continued)

FOREIGN PATENT DOCUMENTS

JP 63283093 A 11/1988
JP 2000114686 A 4/2000

(Continued)

OTHER PUBLICATIONS

Translation JP-2011054607-A (Year: 2011).*

(Continued)

*Primary Examiner* — Nathan Milakovich
(74) *Attorney, Agent, or Firm* — Keating & Bennett, LLP

(57) ABSTRACT

A power supply circuit module includes a power supply circuit including a lower substrate, an upper substrate parallel or substantially parallel to the lower substrate, an inductor, and chip components mounted on the lower substrate, switching circuit components and chip components mounted on the upper substrate, and substrate connectors that connect the lower substrate with the upper substrate electrically and mechanically. A portion of the substrate connectors is an inductor configuring portion of the power supply circuit or a portion of an inductor configuring portion of the power supply circuit.

23 Claims, 15 Drawing Sheets

(56) References Cited

U.S. PATENT DOCUMENTS

| | | | | |
|---|---|---|---|---|
| 2004/0212056 | A1 | 10/2004 | Chen et al. | |
| 2009/0103272 | A1* | 4/2009 | Watanabe | H02M 3/003 361/748 |
| 2010/0254109 | A1 | 10/2010 | Nakamura et al. | |
| 2010/0328010 | A1* | 12/2010 | Noma | H01F 27/34 336/200 |
| 2013/0300210 | A1 | 11/2013 | Hosotani | |
| 2021/0136917 | A1 | 5/2021 | Otsubo et al. | |
| 2021/0359592 | A1* | 11/2021 | Michiaki | H01L 25/18 |

FOREIGN PATENT DOCUMENTS

| | | | |
|---|---|---|---|
| JP | 2004327556 | A | 11/2004 |
| JP | 2010225699 | A | 10/2010 |
| JP | 2011054607 | A * | 3/2011 |
| WO | 2009083890 | A1 | 7/2009 |
| WO | 2012101907 | A1 | 8/2012 |
| WO | 2020017582 | A1 | 1/2020 |

OTHER PUBLICATIONS

International Search Report in PCT/JP2021/024397, mailed Sep. 21, 2021, 4 pages.

Written Opinion in PCT/JP2021/024397, mailed Sep. 21, 2021, 5 pages.

* cited by examiner

104A

POWER SUPPLY CIRCUIT MODULE

CROSS REFERENCE TO RELATED APPLICATIONS

This application claims the benefit of priority to Japanese Patent Application No. 2020-182955 filed on Oct. 30, 2020 and Japanese Patent Application No. 2021-037422 filed on Mar. 9, 2021, and is a Continuation Application of PCT Application No. PCT/JP2021/024397 filed on Jun. 28, 2021. The entire contents of each application are hereby incorporated herein by reference.

BACKGROUND OF THE INVENTION

1. Field of the Invention

The present invention relates to a power supply circuit module mounted on a circuit board or the like of an electronic apparatus.

2. Description of the Related Art

In Japanese Unexamined Patent Application Publication No. 2010-225699, a multilayer mounting structural body with a so-called two-story structure including a plurality of substrates whose main surfaces are arranged in parallel to each other, a substrate connecting member that connects the plurality of substrates, and a member connecting member that is arranged on a substrate main surface of at least one substrate, the member connecting member having a columnar parallel section whose longitudinal direction is arranged in parallel to the substrate main surface, a second end side of the parallel section extending to an end portion of a member main surface, a first end side of the parallel section being connected to a member connecting electrode formed on the substrate main surface, a member whose main surface is arranged orthogonal to the substrate main surface being connected to the second end side of the parallel section, is described.

SUMMARY OF THE INVENTION

In the multilayer mounting structural body described in Japanese Unexamined Patent Application Publication No. 2010-225699, the member that is arranged orthogonal to the substrate main surface can be connected to the second end side of the parallel section. Thus, other members can be connected to the multilayer mounting structural body easily at a high density.

For modularization of a power supply circuit such as a DC-DC converter circuit, not only simply densifying the power supply circuit by adopting the two-story structure but exhibiting excellent electrical characteristics is also desirable.

Accordingly, preferred embodiments of the present invention provide power supply circuit modules each being compact in size by adopting a two-story structure and exhibiting excellent electrical characteristics.

A power supply circuit module as an example embodiment of the present disclosure includes a power supply circuit including a lower substrate, an upper substrate parallel or substantially parallel to the lower substrate, a lower-substrate-side component that is mounted on the lower substrate, an upper-substrate-side component that is mounted on the upper substrate, and a plurality of substrate connectors that connect the lower substrate with the upper substrate electrically and mechanically. A portion of the plurality of substrate connectors is an inductor configuring portion of the power supply circuit or a portion of an inductor configuring portion of the power supply circuit.

According to preferred embodiments of the present invention, power supply circuit modules that each include an upper substrate on which components are mounted and a lower substrate on which components are mounted, thus achieves a reduction in size, effectively uses a parasitic component caused by a substrate connector, and exhibits excellent electrical characteristics, can be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
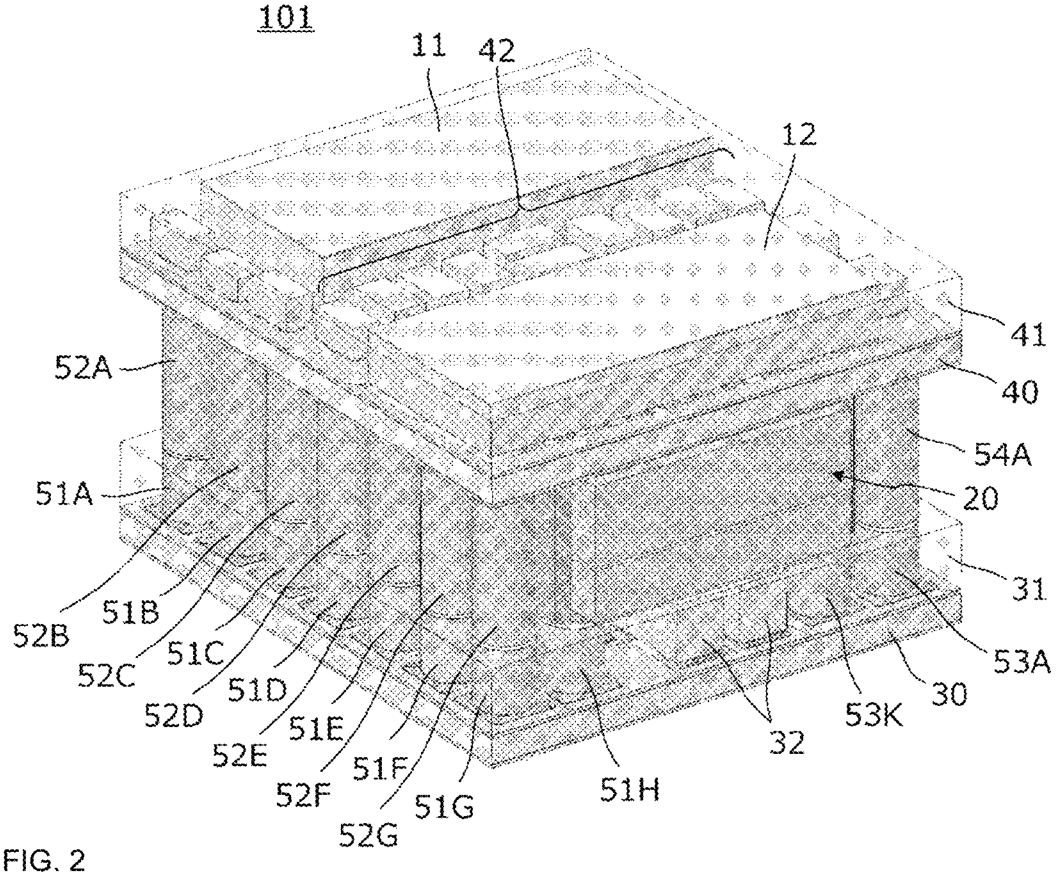
FIG. 1 is a perspective view of a power supply circuit module 101 according to a first preferred embodiment of the present invention.

Hereinafter, preferred embodiments of the present invention will be described with specific examples with reference to drawings. In the drawings, the same parts are denoted by the same reference signs. In view of ease of explanation or understanding of main points, for convenience of explanation of preferred embodiments, a plurality of preferred embodiments will be described separately. However, partial replacement or combination of configurations described in different preferred embodiments can be made. In second and subsequent preferred embodiments, description of features common to the first preferred embodiment will be omitted and only features different from the first preferred embodiment will be described. In particular, similar operational advantages brought by similar configurations will not be mentioned in individual preferred embodiments.

First Preferred Embodiment

FIG. 1 is a perspective view of a power supply circuit module 101 according to a first preferred embodiment. The power supply circuit module 101 includes a power supply circuit including a lower substrate 30, an upper substrate 40 that is parallel to the lower substrate 30, and a plurality of substrate connecting members that connect the lower substrate 30 with the upper substrate 40 electrically and mechanically. An upper surface of each of the lower substrate 30 and the upper substrate 40 is a mounting surface. The mounting surface of the lower substrate 30 and the mounting surface of the upper substrate 40 are parallel or substantially parallel to each other. Furthermore, the upper surface of the lower substrate 30 and a lower surface of the upper substrate 40 face each other in a substrate thickness direction.

Chip components 32 and an inductor element 20 are mounted on the lower substrate 30. The chip components 32 and the inductor element 20 are lower-substrate-side components. Chip components 42 and switching circuit components 11 and 12 are mounted on the upper substrate 40. The chip components 42 and the switching circuit components 11 and 12 are the above-mentioned substrate-side components. A lower-substrate-side resin layer 31 covers the lower substrate 30. An upper-substrate-side resin layer 41 covers the upper substrate 40. In FIG. 1 (and also in FIGS. 2, 3, and so on described later), the lower-substrate-side resin layer 31 and the upper-substrate-side resin layer 41 are illustrated in a transparent manner.

Figure 2:
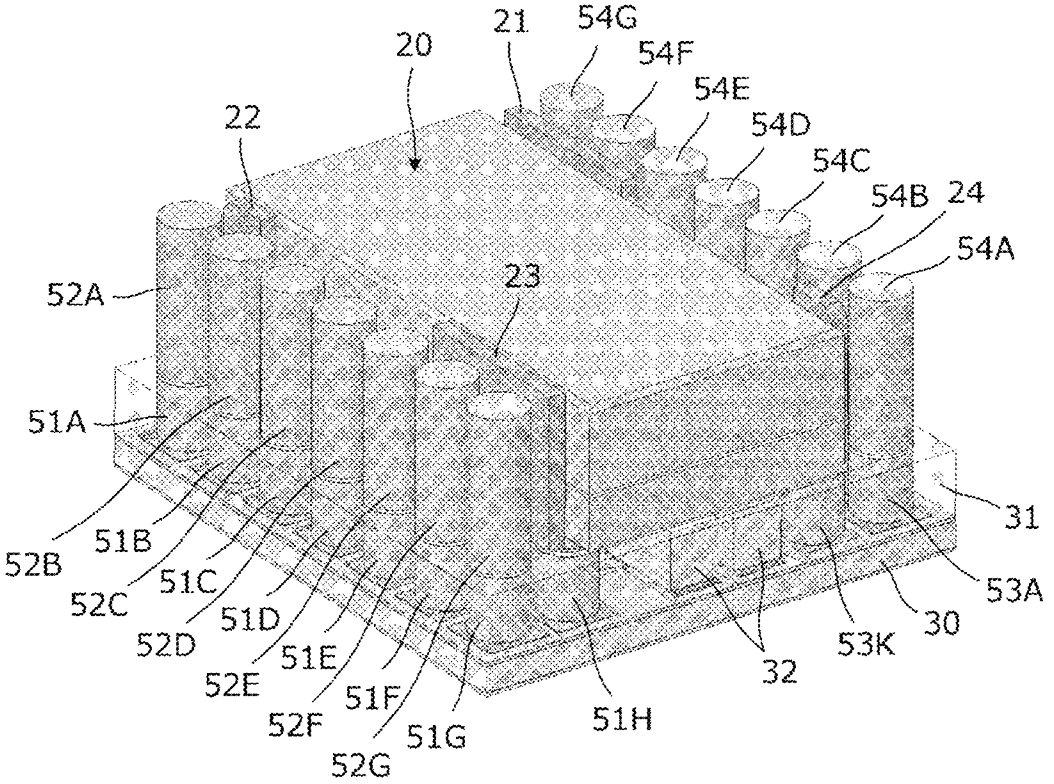
FIG. 2 is a perspective view of a state in which an upper substrate 40 is removed together with an upper-substrate-side component and an upper-substrate-side resin layer 41 from the state illustrated in FIG. 1.

FIG. 2 is a perspective view of a state in which the upper substrate 40 is removed together with the upper-substrate-side components and the upper-substrate-side resin layer 41 from the state illustrated in FIG. 1. As illustrated in FIGS. 1 and 2, substrate connecting members 51A to 51H, 52A to 52G, 53A, and 54A to 54G that connect the lower substrate 30 with the upper substrate 40 electrically and mechanically, and the like are provided between the lower substrate 30 and the upper substrate 40. The substrate connecting members are cylinder-shaped metal bodies such as copper pins.

Figure 3:
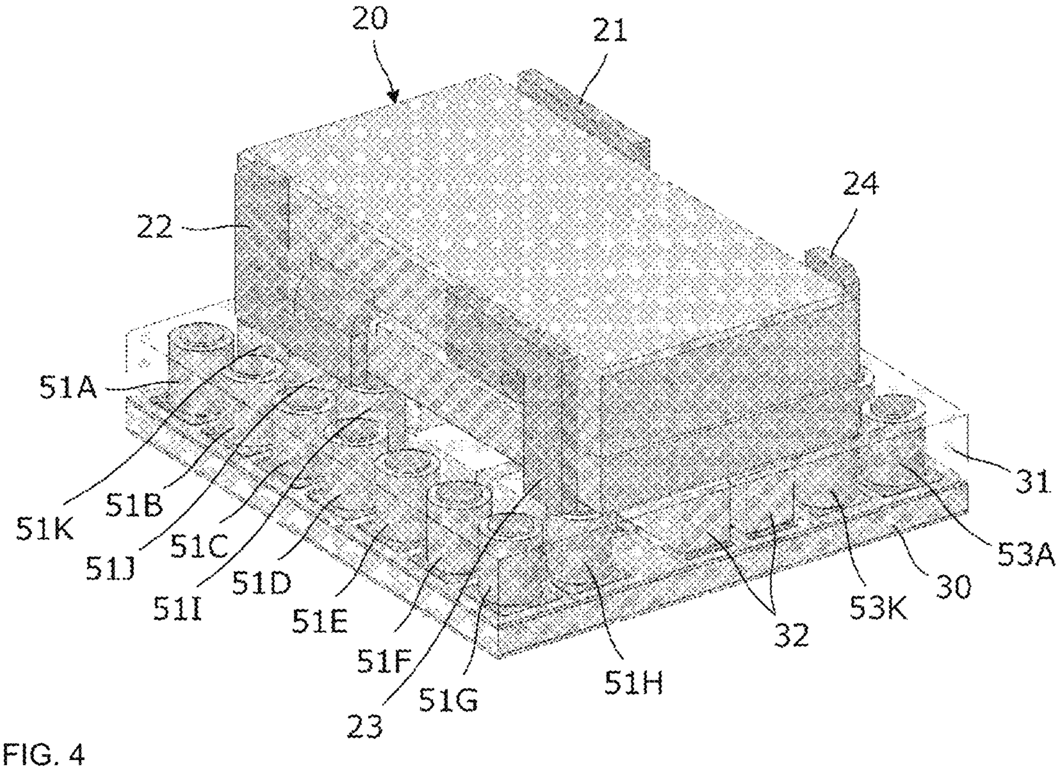
FIG. 3 is a perspective view of a state in which substrate connecting members 52A to 52G and 54A to 54G are further removed from the state illustrated in FIG. 2.
Figure 4:
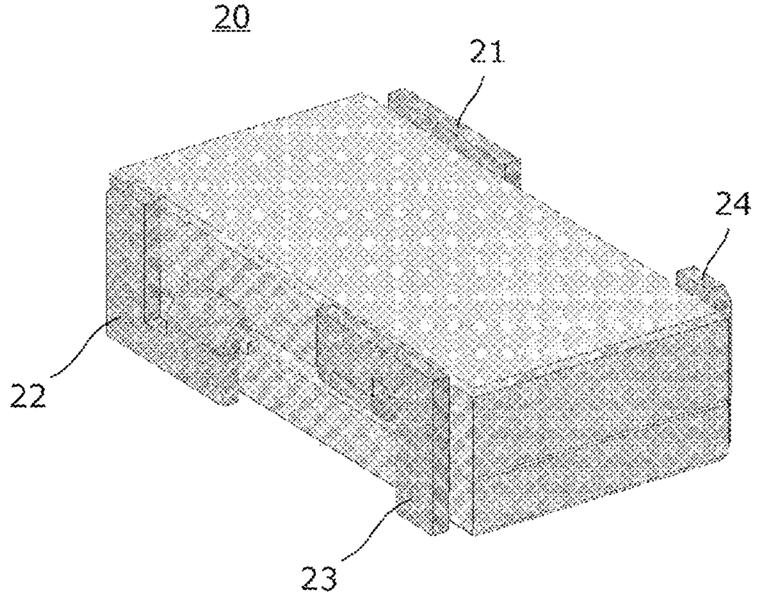
FIG. 4 is a perspective view of an inductor element 20 alone.
Figure 5:
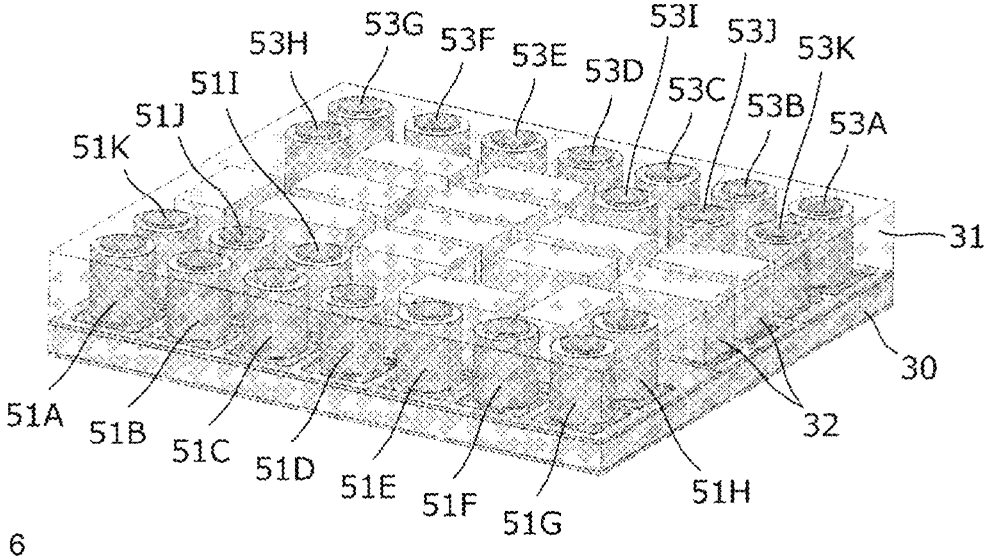
FIG. 5 is a perspective view of a state in which the inductor element 20 is removed from the state illustrated in FIG. 3.

FIG. 3 is a perspective view of a state in which the substrate connecting members 52A to 52G and 54A to 54G are further removed from the state illustrated in FIG. 2. FIG. 4 is a perspective view of the inductor element 20 alone. FIG. 5 is a perspective view of a state in which the inductor element 20 is removed from the state illustrated in FIG. 3.

The inductor element 20 has a cuboid shape as a whole and includes input-side terminals 21 and 23 and output-side terminals 22 and 24 in sides of the inductor element 20. As illustrated in FIGS. 3, 4, and 5, the terminal 21 of the inductor element 20 is electrically connected to a substrate connecting member 53H and the terminal 23 is electrically connected to the substrate connecting member 51H. Furthermore, the terminal 22 of the inductor element 20 is electrically connected to substrate connecting members 51I, 51J, and 51K and the terminal 24 is electrically connected to substrate connecting members 53I, 53J, and 53K.

Figure 6:
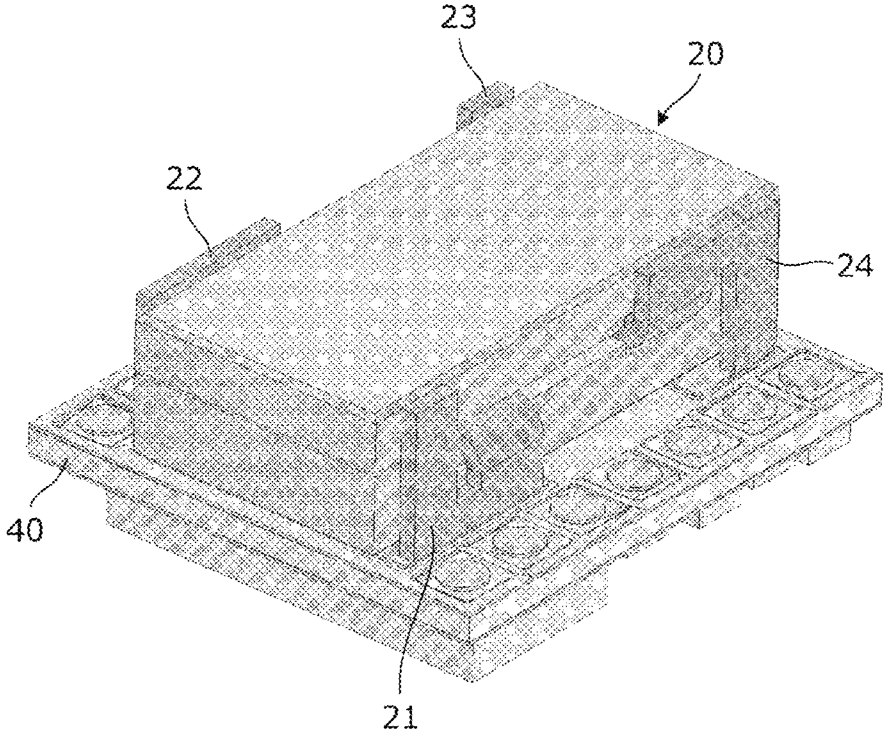
FIG. 6 is a perspective view illustrating the positional relationship between the upper substrate 40 and an inductor element 20 that is in contact with the upper substrate 40.
Figure 7:
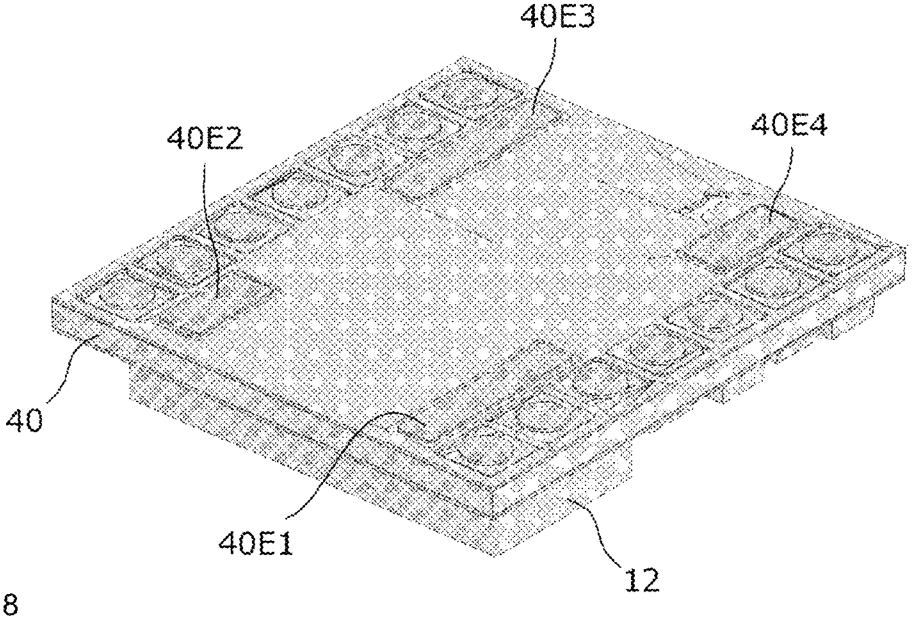
FIG. 7 is a perspective view illustrating a lower surface of the upper substrate 40.

FIG. 6 is a perspective view illustrating the positional relationship between the upper substrate 40 and the inductor element 20 that is in contact with the upper substrate 40. FIG. 7 is a perspective view illustrating the lower surface of the upper substrate 40. FIGS. 6 and 7 each illustrate a vertically flipped state.

As illustrated in FIGS. 6 and 7, the input-side terminals 21 and 23 of the inductor element 20 are electrically connected to electrodes 40E1 and 40E3 of the upper substrate 40, respectively, and the output-side terminals 22 and 24 are electrically connected to electrodes 40E2 and 40E4 of the upper substrate 40, respectively.

The input-side terminal 21 of the inductor element 20 and the substrate connecting member 53H configure a substrate connecting member that connects the lower substrate 30 with the upper substrate 40 electrically and mechanically. Similarly, the input-side terminal 23 and the substrate connecting member 51H configure a substrate connecting member. Furthermore, the output-side terminal 22 of the inductor element 20 and the substrate connecting members 51I, 51J, and 51K configure a substrate connecting member that connects the lower substrate 30 with the upper substrate 40 electrically and mechanically. Similarly, the output-side terminal 24 and the substrate connecting members 53I, 53J, and 53K configure a substrate connecting member. As described later, the input-side terminals 21 and 23 and the output-side terminals 22 and 24 of the inductor element 20 use parasitic inductances thereof as passive components. Furthermore, lower ends of the input-side terminals 21 and 23 and the output-side terminals 22 and 24 are connected to electrodes of the lower substrate 30. Upper ends of the input-side terminals 21 and 23 and the output-side terminals 22 and 24 are connected to electrodes of the upper substrate 40.

As with the above-mentioned terminals of the inductor, connecting portions of substrate connecting members are also electrically and mechanically connected by soldering or conductive adhesive. For example, lower surfaces of the substrate connecting members 51A to 51K and 53A to 53K are connected to electrodes of the lower substrate 30. Furthermore, lower surfaces of the substrate connecting members 52A to 52G and 54A to 54G are connected to upper surfaces of the substrate connecting members 51A to 51G and 53A to 53G, and upper surfaces of the substrate connecting members 52A to 52G and 54A to 54G are connected to electrodes of the upper substrate 40.

Figure 8:
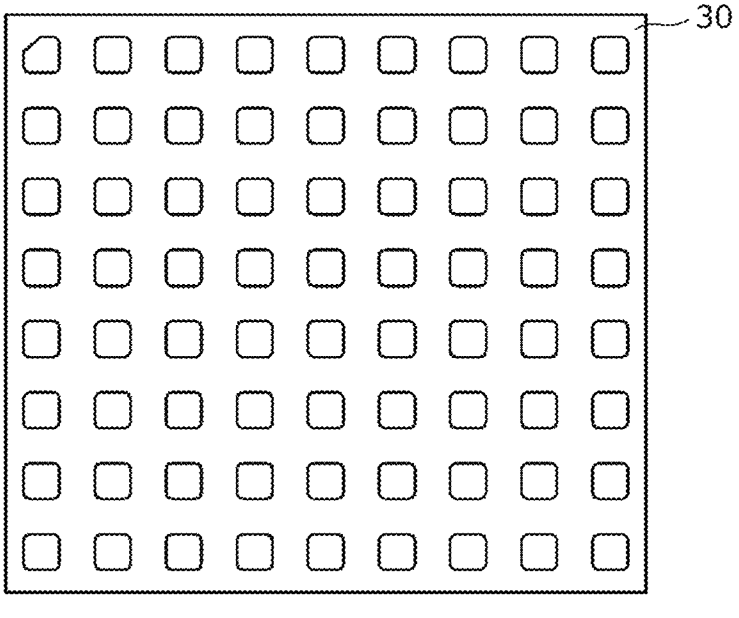
FIG. 8 is a bottom view of a lower substrate 30.

FIG. 8 is a bottom view of the lower substrate 30. A plurality of electrodes are arranged on a lower surface of the lower substrate 30. The plurality of electrodes are connected to a mounting substrate by soldering or the like, and the power supply circuit module 101 can thus be mounted on the mounting substrate.

As illustrated in FIG. 1, the chip components 42, which are different from the two switching circuit components 11 and 12, are disposed between the two switching circuit components 11 and 12. The chip components 42 are, for example, capacitor configuring portions of a DC-DC converter circuit. The chip components 42, which are different from the switching circuit components 11 and 12, generate less heat, and the switching circuit components 11 and 12 are thermally divided from each other by the chip components 42. Furthermore, the two switching circuit components 11 and 12 are dispersed on the upper substrate 40. Thus, an excessive increase in the temperature of the switching circuit components 11 and 12 is suppressed or prevented.

As illustrated in FIG. 1, the upper-substrate-side resin layer 41 that seals the chip components 42 and the switching circuit components 11 and 12 is provided at the upper substrate 40. The upper-substrate-side resin layer 41 has a flat upper surface. Thus, suction in the process of manufacturing can be achieved easily. Furthermore, a heat dissipating component such as a heatsink can be mounted on the surface, and excellent heat dissipation characteristics can thus be achieved easily.

Figure 9:
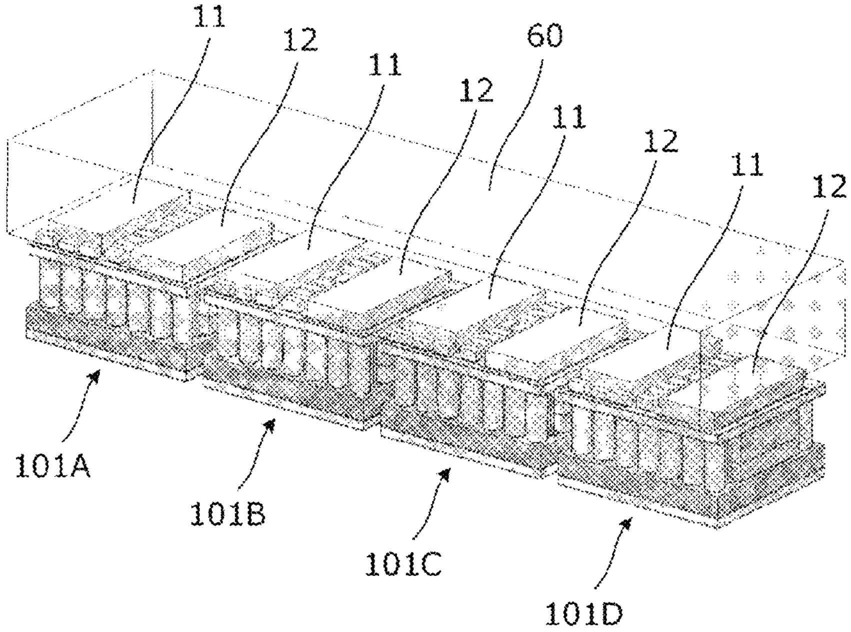
FIG. 9 is a perspective view of a plurality of power supply circuit modules mounted on a mounting substrate.

FIG. 9 is a perspective view of a plurality of power supply circuit modules mounted on a mounting substrate. However, the mounting substrate is not illustrated in FIG. 9. In this example, a heat dissipator 60 is mounted on upper surfaces of four power supply circuit modules 101A, 101B, 101C, and 101D. In FIG. 9, the heat dissipator 60 is illustrated in a transparent manner. No upper-substrate-side resin layers are formed on upper substrates of the power supply circuit modules 101A, 101B, 101C, and 101D. Therefore, the switching circuit components 11 and 12 for the power supply circuit modules 101A, 101B, 101C, and 101D are thermally coupled to the heat dissipator 60 directly, and heat dissipation of the switching circuit components 11 and 12 can thus be achieved effectively.

Figure 10:
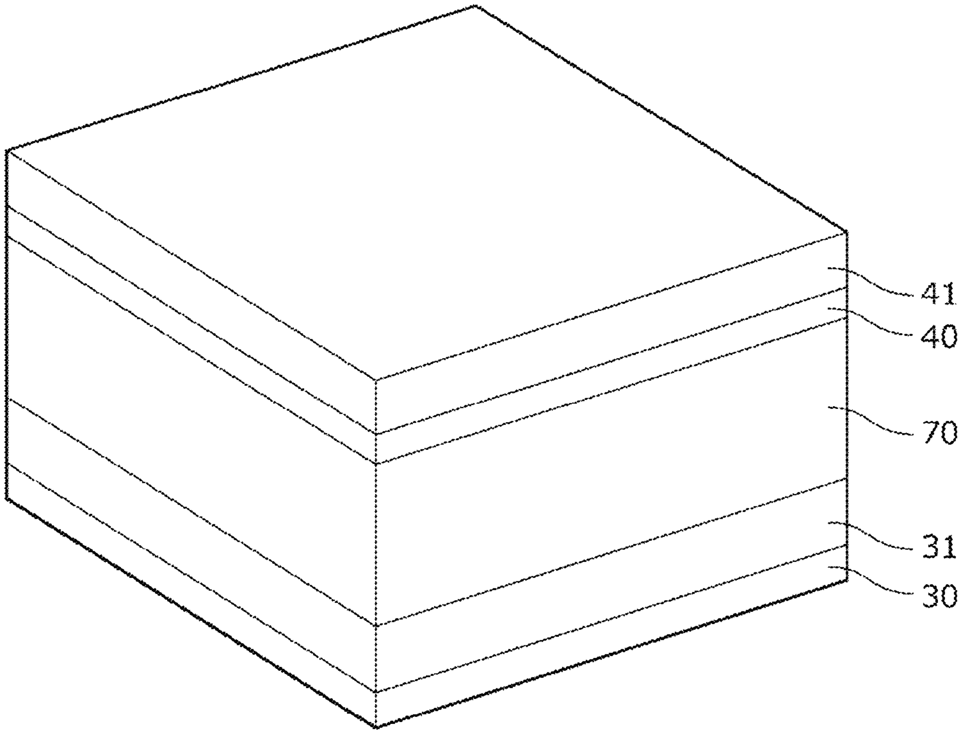
FIG. 10 is a perspective view of a power supply circuit module with a structure different from that of the power supply circuit module illustrated in FIG. 1.

FIG. 10 is a perspective view of a power supply circuit module with a structure different from that of the power supply circuit module illustrated in FIG. 1. In this example, a substrate mold 70 made of an insulating resin fills up between the lower-substrate-side resin layer 31 and the upper substrate 40. Thus, areas between the terminals 21 to 24 of the inductor element 20 and corresponding substrate connecting members that are adjacent to the terminals 21 to 24 are filled up with the above-mentioned insulating resin. With this structure, electrical insulation characteristics between the terminals 21 to 24 of the inductor element 20 and the substrate connecting members can further be ensured.

Figure 11:
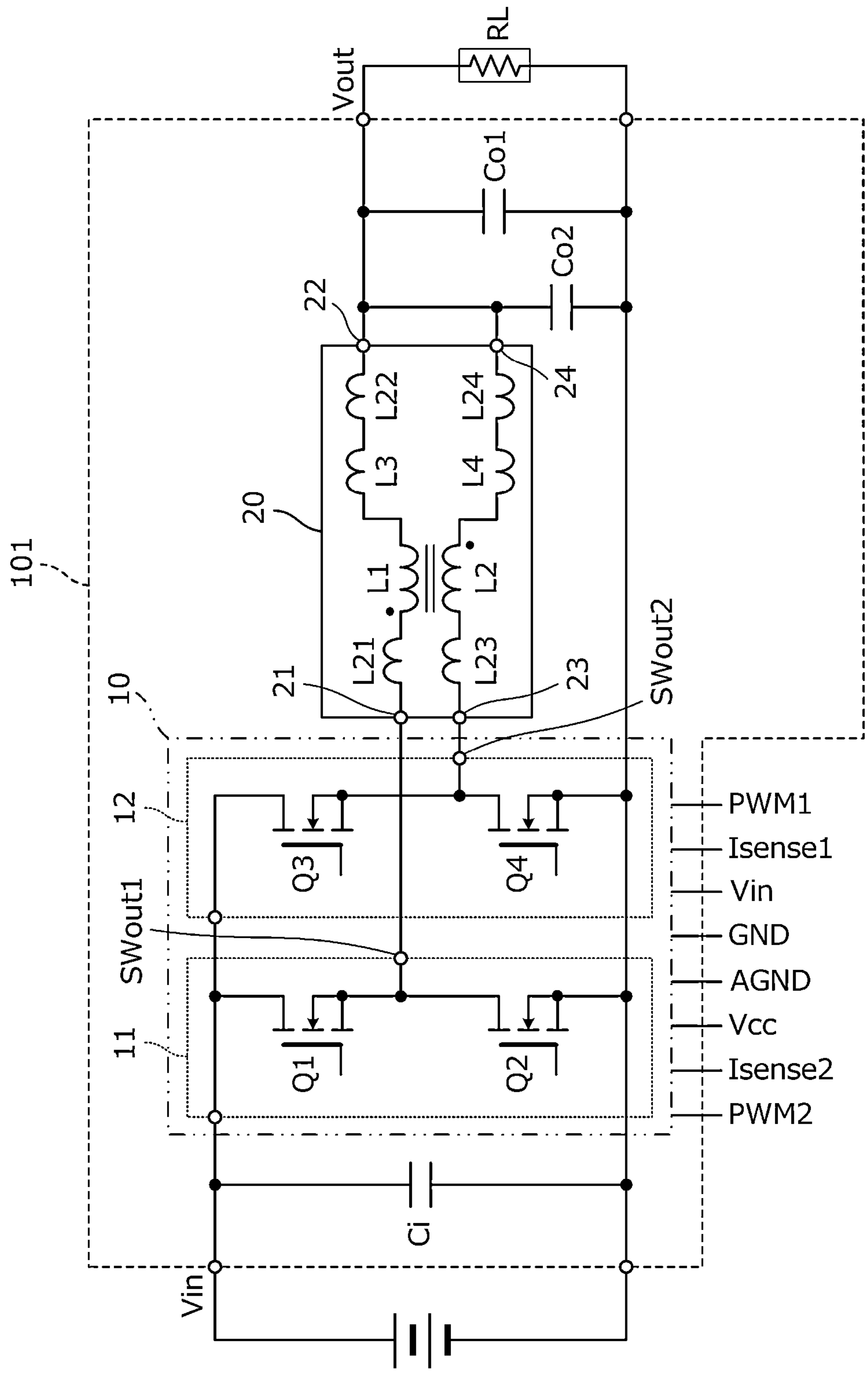
FIG. 11 is a circuit diagram of a power supply circuit formed in the power supply circuit module 101 according to the first preferred embodiment of the present invention.

FIG. 11 is a circuit diagram of a power supply circuit in the power supply circuit module 101 according to the first preferred embodiment. This power supply circuit is a DC-DC converter including a switching circuit 10, the inductor element 20, and smoothing capacitors Co1, Co2, and Ci. In this example, the switching circuit 10 is a two-phase half-bridge circuit, and the inductor element 20 is connected between the output of the half-bridge circuit and a load (resistor RL).

The switching circuit 10 includes the switching circuit components 11 and 12. The switching circuit component 11 includes a high-side switching element Q1, a low-side switching element Q2, and a driving circuit that drives the high-side switching element Q1 and the low-side switching element Q2. Similarly, the switching circuit component 12 includes a high-side switching element Q3, a low-side switching element Q4, and a driving circuit that drives the high-side switching element Q3 and the low-side switching element Q4. The switching circuit component 11 may include a control circuit that controls the switching elements Q1 and Q2. Similarly, the switching circuit component 12 may include a control circuit that controls the switching elements Q3 and Q4.

The inductor element 20 is a coupled inductor including coils L1 and L2 that are magnetically coupled to each other at a predetermined coupling coefficient. Inductors L3 and L4 illustrated in FIG. 11 represent leakage inductances caused by non-coupling between the coils L1 and L2, using circuit symbols. Furthermore, inductors L21 and L23 represent parasitic inductances generated at the input-side terminals 21 and 23, respectively, using circuit symbols. Similarly, inductors L22 and L24 represent parasitic inductances generated at the output-side terminals 22 and 24, respectively, using circuit symbols. Since the inductors L21 and L22 are connected in series to the inductor L3, a circuit in which a composite inductance generated by the series connection between the inductor L3 and the inductors L21 and L22 is connected to an output of the switching circuit component 11 is configured. Similarly, since the inductors L23 and L24 are connected in series to the inductor L4, a circuit in which a composite inductance generated by the series connection between the inductor L4 and the inductors L23 and L24 is connected to an output of the switching circuit component 12 is configured.

The switching elements Q1, Q2, Q3, and Q4 of the switching circuit components 11 and 12 are driven with two phases with a phase difference of 180 degrees. The smoothing capacitors Co1 and Co2 are connected in parallel to each other so that variations in an output voltage Vout are smoothed. The smoothing capacitor Ci smooths the voltage of an input voltage Vin. In FIG. 11, the load connected to the output of the power supply circuit module 101 is represented by the resistor RL.

In this preferred embodiment, with the two-phase DC-DC converter in which inductors of two DC-DC converters are magnetically coupled to each other, ripples of the output voltage can be effectively reduced. Furthermore, a mutual inductor generated by magnetic coupling decreases voltage to be applied to the coils L1 and L2. Thus, the inductances of the coils L1 and L2 can be reduced. Therefore, responsiveness to load response can be increased.

In FIG. 11, power supply and signals input to and output from the switching circuit 10 are represented as described below.

Vin: input power supply line

GND: ground

Vcc: power supply voltage line for control circuits of switching circuit components 11 and 12

AGND: ground of control circuits of switching circuit components 11 and 12

Isense1: detection signal of current flowing in inductor L3

Isense2: detection signal of current flowing in inductor L4

PWM1: switching control signal of switching elements Q1 and Q2

PWM2: switching control signal of switching elements Q3 and Q4

The relationship between the substrate connecting members illustrated in FIGS. 1 to 5 and the power supply and signal lines mentioned above is as described below.

GND: 51E, 51F, 51G, 52E, 52F, 52G, 53F, 54F

Vin: 53E, 54E

Vcc: 53G, 54G

Furthermore, signals such as Isense1, Isense2, PWM1, and PWM2 pass through the substrate connecting members 51A to 51D and 52A to 52D.

Accordingly, ground lines and power supply lines are disposed near the input-side terminals 21 and 23 of the inductor element 20 or the input-side terminals 21 and 23 are surrounded by the ground lines and the power supply lines. Thus, an area near the input-side terminals 21 and 23 of the inductor element 20 with a large voltage change is shielded by the ground lines and the power supply lines. As a result, unwanted radiation from the inductor element 20 can be effectively reduced.

It is desirable that influence by input/output current of inductors on the substrate connecting members 51A to 51D and 52A to 52D through which signals pass be reduced. Thus, shield members such as metal plates may be provided between the terminals 21 to 24 of the inductor element 20 and the substrate connecting members 51A to 51D and 52A to 52D. The shield members are not necessarily metal plates and may be columnar conductors. Furthermore, the shield members may be connected to the ground.

Figure 12:
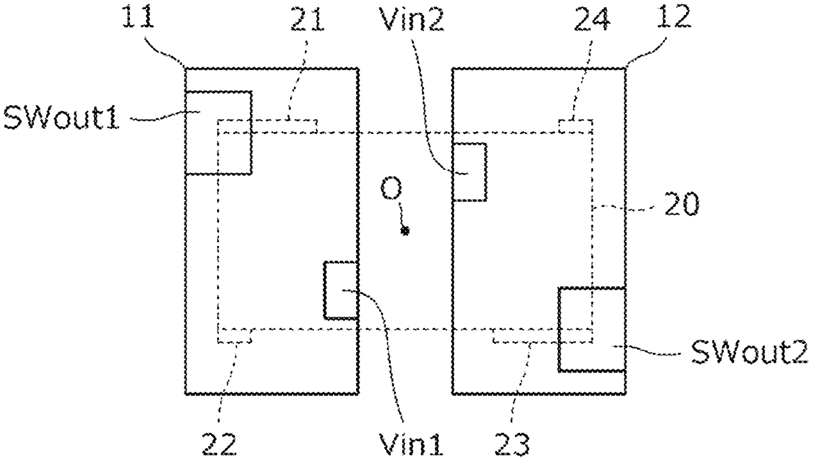
FIG. 12 is a diagram illustrating the arrangement relationship between the inductor element 20 and switching circuit components 11 and 12.

FIG. 12 is a diagram illustrating the arrangement relationship between the inductor element 20 and the switching circuit components 11 and 12. FIG. 12 is a perspective plan view from a direction orthogonal to the mounting surfaces of the lower substrate 30 and the upper substrate 40 illustrated in FIG. 1, and the terminals 21 to 24 of the inductor element 20 and the switching circuit components 11 and 12 overlap. The inductor element 20 includes four terminals: the input-side terminals 21 and 23 and the output-side terminals 22 and 24, that are disposed point-symmetrically with respect to a center point O of the inductor element 20. The switching circuit components 11 and 12 are disposed in parallel or substantially in parallel to each other in such a manner that the positions of the input-side terminals and the output-side terminals are in a 180-degree rotational relationship.

In the example illustrated in FIG. 12, the input-side terminal 21 of the inductor element 20 is close to the output terminal SWout1 of the switching circuit component 11, and the input-side terminal 23 of the inductor element 20 is close to the output terminal SWout2 of the switching circuit component 12. Thus, a parasitic resistance at a connection path between the inductor element 20 and each of the switching circuit components 11 and 12 is the minimum.

Furthermore, in the example illustrated in FIG. 12, the power supply input terminal Vin1 of the switching circuit component 11 and the power supply input terminal Vin2 of the switching circuit component 12 are close to each other. Thus, connection lines for the power supply input terminals Vin1 and Vin2 are shortened evenly, and the total parasitic resistance in lines connected to the power supply input terminals Vin1 and Vin2 is reduced. Furthermore, the smoothing capacitor Ci connected to the power supply input terminals Vin1 and Vin2 can be configured as a single component. In the case where the output terminals SWout1 and SWout2 of the switching circuit components 11 and 12 are disposed close to each other, the smoothing capacitors Co1 and Co2 can be configured as a single component.

Second Preferred Embodiment

In a second preferred embodiment, a power supply circuit module characterized in a configuration of terminals of an inductor will be described as an example.

Figure 13:
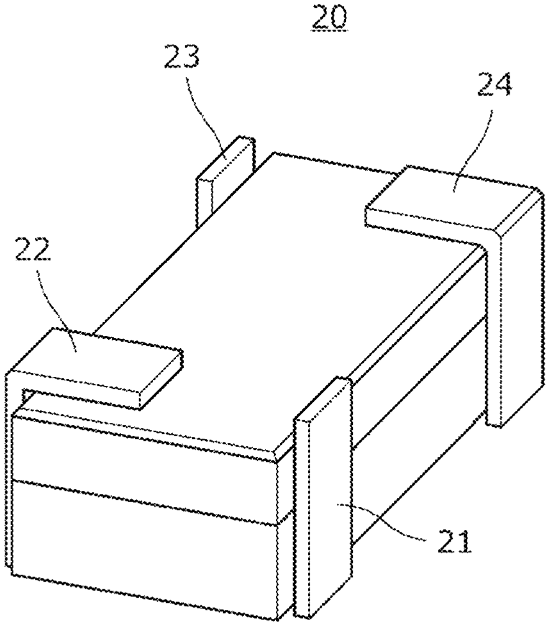
FIG. 13 is a perspective view of the inductor element 20 provided in a power supply circuit module according to a second preferred embodiment of the present invention.

FIG. 13 is a perspective view of the inductor element 20 provided in a power supply circuit module according to the second preferred embodiment. The inductor element 20 includes the input-side terminals 21 and 23 and the output-side terminals 22 and 24.

The output-side terminals 22 and 24 each have a wide section that is in contact with an electrode on the lower surface of the upper substrate (upper substrate 40 in the example illustrated in FIG. 1). The electrodes that are in contact with the output-side terminals 22 and 24 of the inductor element 20 are provided on the lower surface of the upper substrate. Thus, electrical and mechanical connection between the output-side terminals 22 and 24 of the inductor element 20 and the electrodes on the upper substrate side to which the output-side terminals 22 and 24 are electrically connected is strengthened. In the example illustrated in FIG. 13, the output-side terminals 22 and 24 include wide sections. However, the input-side terminals 21 and 23 may have wide sections. Furthermore, all the terminals 21 to 24 may have wide sections.

Third Preferred Embodiment

Figure 14A:
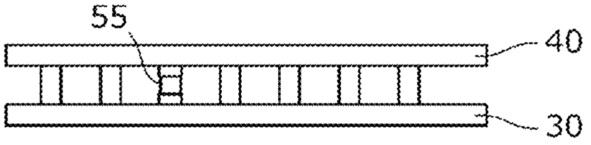
FIGS. 14A and 14B are front views of a main portion of a power supply circuit module according to a third preferred embodiment of the present invention.
Figure 14B:
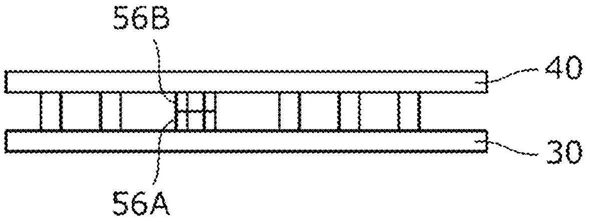

In a third preferred embodiment, other examples of substrate connecting members will be described. FIGS. 14A and 14B are front views of main portions of a power supply circuit module according to the third preferred embodiment.

In the example illustrated in FIG. 14A, a plurality of substrate connecting members are located between the lower substrate 30 and the upper substrate 40. Out of the plurality of substrate connecting members, a chip component 55 is connected in series between an electrode formed on the upper surface of the lower substrate 30 and an electrode formed on the lower surface of the upper substrate 40. The chip component 55 is, for example, a chip capacitor, a chip inductor, or a chip resistor, and defines a portion of a circuit of the power supply circuit module.

In the example illustrated in FIG. 14B, a plurality of substrate connecting members are located between the lower substrate 30 and the upper substrate 40. One of the plurality of substrate connecting members includes chip components 56A and 56B. The chip component 56A is mounted on the upper surface of the lower substrate 30, and the chip component 56B is mounted on the lower surface of the upper substrate 40. Furthermore, the chip component 56A and the chip component 56B are connected electrically and mechanically. The chip components 56A and 56B are connected in parallel to each other. This parallel circuit is connected to an electrode formed on the upper surface of the lower substrate 30 and an electrode formed on the lower surface of the upper substrate 40. The chip components 56A and 56B are, for example, chip capacitors, chip inductors, or chip resistors, and define a portion of a circuit of the power supply circuit module.

As described above in this preferred embodiment, a substrate connecting member is not necessarily a terminal of a component and may be a passive component configuring portion of a power supply circuit or part of a passive component.

Fourth Preferred Embodiment

Figure 15:
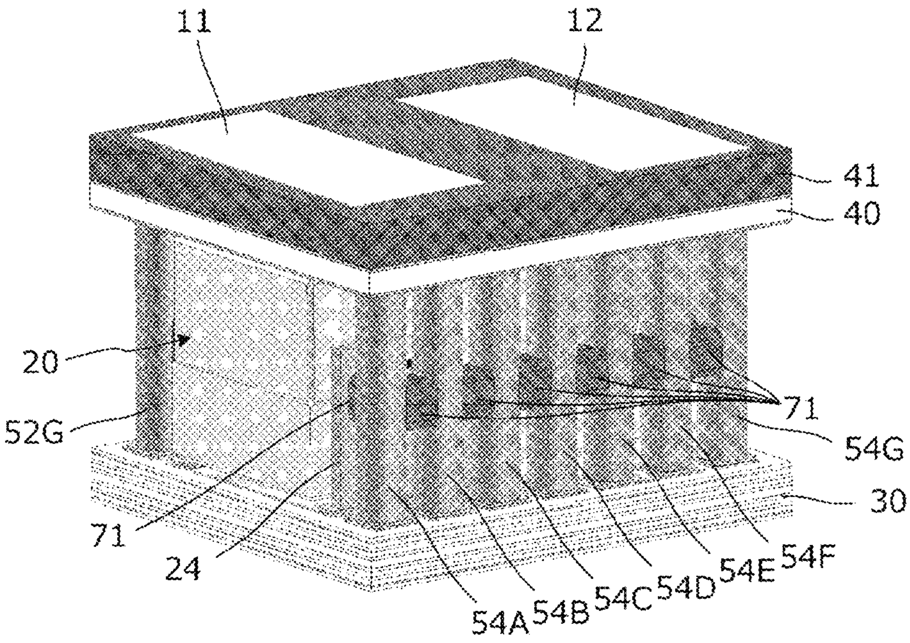
FIG. 15 is a perspective view of a power supply circuit module 104A according to a fourth preferred embodiment of the present invention.
Figure 16:
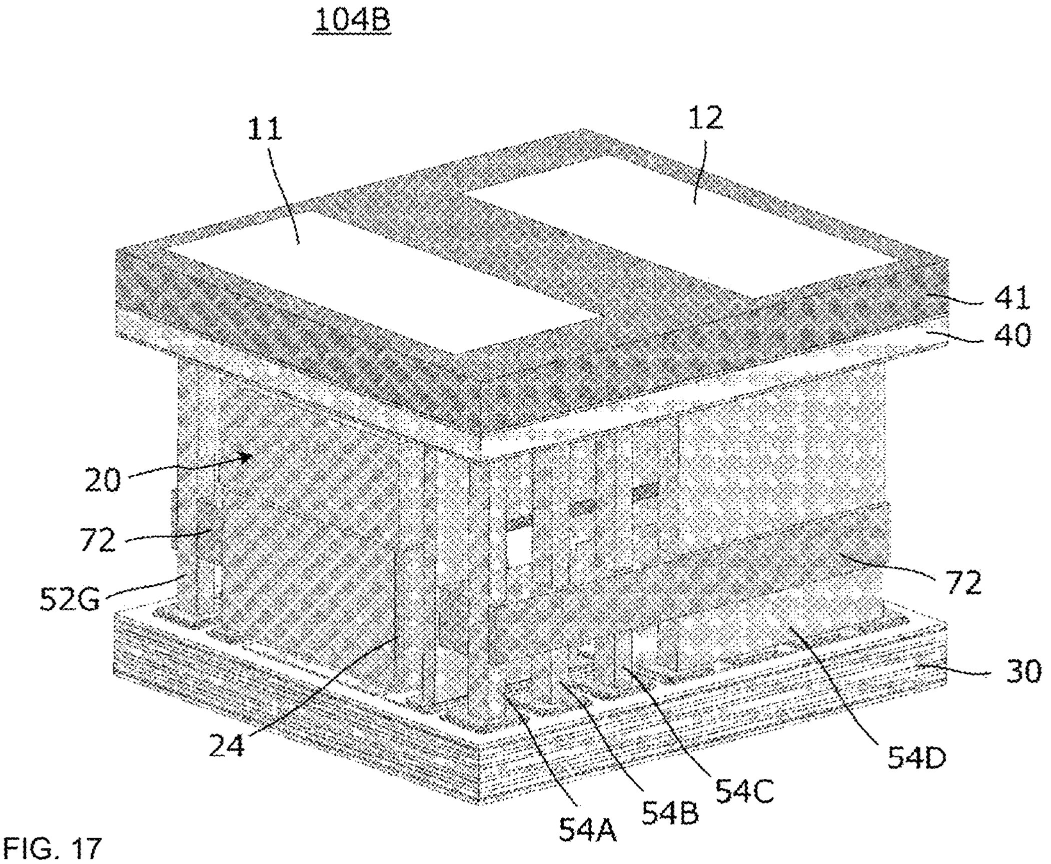
FIG. 16 is a perspective view of a power supply circuit module 104B according to the fourth preferred embodiment of the present invention.

FIG. 15 is a perspective view of a power supply circuit module 104A according to a fourth preferred embodiment. FIG. 16 is a perspective view of a power supply circuit module 104B according to the fourth preferred embodiment. Each of the power supply circuit modules 104A and 104B includes the lower substrate 30, the upper substrate 40 that is parallel to the lower substrate 30, and a plurality of substrate connecting members that connect the lower substrate 30 with the upper substrate 40 electrically and mechanically.

The lower substrate 30 is a multilayer substrate. Chip components and the inductor element 20 are mounted on the lower substrate 30. Chip components and the switching circuit components 11 and 12 are mounted on the upper substrate 40. The upper-substrate-side resin layer 41 covers the upper substrate 40.

In the example illustrated in FIG. 15, the substrate connecting members 52G and 54A to 54G that connect the lower substrate 30 with the upper substrate 40 electrically and mechanically are illustrated. Substrate connecting members that are adjacent to each other are connected with an insulating resin body 71 interposed therebetween. That is, the insulating resin body 71 is interposed between adjacent substrate connecting members. The resin body 71 is formed by coating. The other schematic configurations are similar to those described above in the first preferred embodiment.

In FIG. 16, the substrate connecting members 52G and 54A to 54D that connect the lower substrate 30 with the upper substrate 40 electrically and mechanically are illustrated. Predetermined height positions of the substrate connecting members are padded with insulating resin bodies 72. That is, the substrate connecting members penetrate through the insulating resin bodies 72. The other schematic configurations are similar to those described above in the first preferred embodiment.

With the configurations described above, the relative position between the plurality of substrate connecting members and the relative position between each of the substrate connecting members and a terminal of the inductor element 20 can be fixed. Therefore, the electrical insulation characteristics among the plurality of substrate connecting members and terminals of the inductor element 20 can be ensured. For example, a situation in which displacement of the relative position between the plurality of substrate connecting members at the time of manufacturing causes the plurality of substrate connecting members to contact with each other or causes a substrate connecting member to contact with a terminal of the inductor element 20, which results in short circuiting, may be suppressed or prevented.

Fifth Preferred Embodiment

Figure 17:
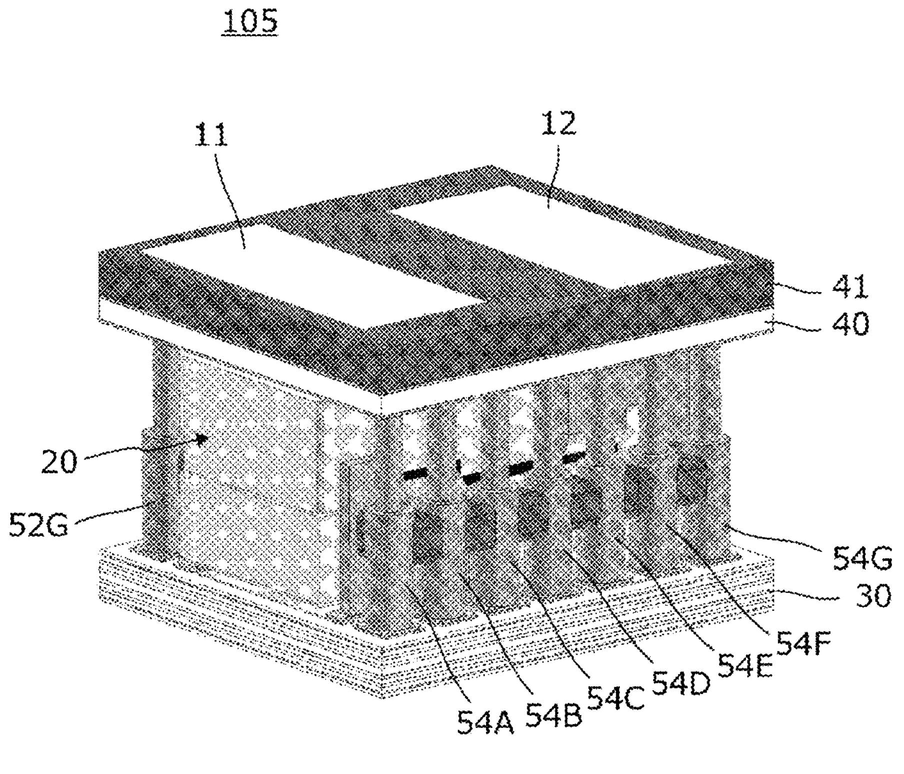
FIG. 17 is a perspective view of a power supply circuit module 105 according to a fifth preferred embodiment of the present invention.

FIG. 17 is a perspective view of a power supply circuit module 105 according to a fifth preferred embodiment. The power supply circuit module 105 includes the lower substrate 30, the upper substrate 40 that is parallel or substantially parallel to the lower substrate 30, and a plurality of substrate connecting members that connect the lower substrate 30 with the upper substrate 40 electrically and mechanically.

In the example illustrated in FIG. 17, the plurality of substrate connecting members 52G and 54A to 54G that connect the lower substrate 30 with the upper substrate 40 electrically and mechanically are illustrated. Areas of lower surfaces of the substrate connecting members 52G and 54A to 54G are larger than areas of upper surfaces of the substrate connecting members 52G and 54A to 54G. With this configuration, the center of gravity of the power supply circuit module 105 is lowered. Therefore, at the time of manufacturing, overturning caused by vibrations or the like can be reduced, and productivity can thus be improved.

Sixth Preferred Embodiment

In a sixth preferred embodiment, a power supply circuit module in which a metal plate for protection and heat dissipation is provided at an upper-substrate-side resin layer will be described as an example.

Figure 18:
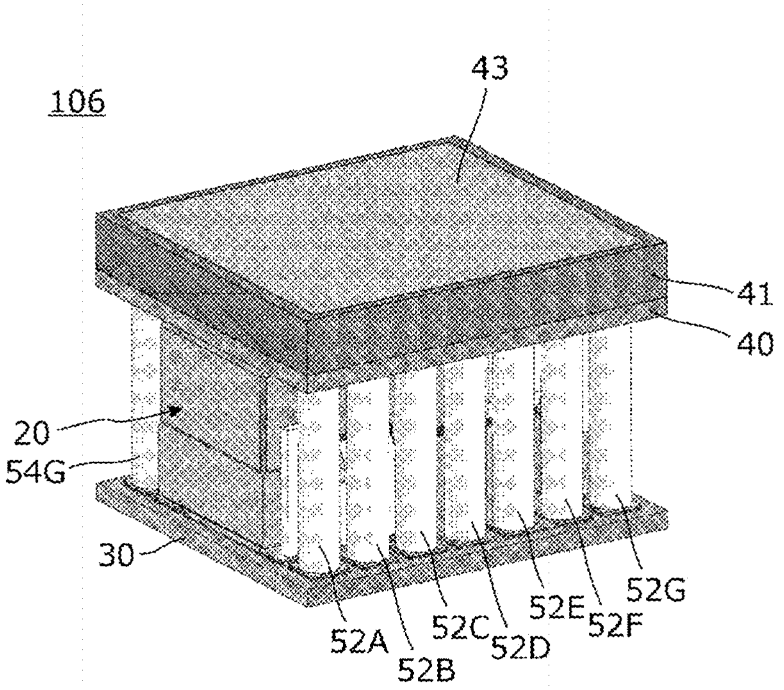
FIG. 18 is a perspective view of a power supply circuit module 106 according to a sixth preferred embodiment of the present invention.
Figure 19:
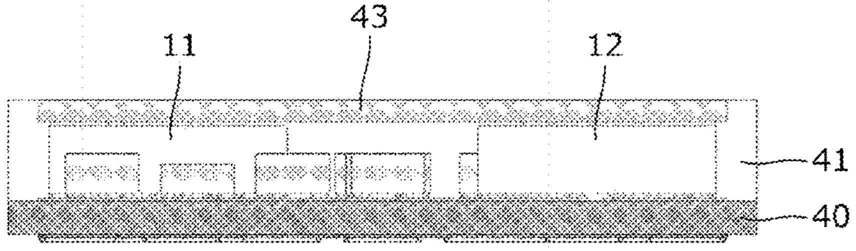
FIG. 19 is a front perspective view of an upper portion of the power supply circuit module 106 illustrated in FIG. 18.

FIG. 18 is a perspective view of a power supply circuit module 106 according to a sixth preferred embodiment. FIG. 19 is a front perspective view of an upper portion of the power supply circuit module 106 illustrated in FIG. 18.

The power supply circuit module 106 includes the lower substrate 30, the upper substrate 40 that is parallel or substantially parallel to the lower substrate 30, the plurality of substrate connecting members 52A to 52G and 54G that connect the lower substrate 30 with the upper substrate 40 electrically and mechanically, and the like.

The lower substrate 30 is a multilayer substrate. Chip components and the inductor element 20 are mounted on the lower substrate 30.

As illustrated in FIG. 19, a plurality of chip components and the switching circuit components 11 and 12 are mounted on the upper substrate 40. Furthermore, the upper-substrate-side resin layer 41 covers the upper surface of the upper substrate 40. A metal plate 43 is provided at the upper-substrate-side resin layer 41 in such a manner that the metal plate 43 is exposed to the outer surface of the upper-substrate-side resin layer 41. The metal plate 43 is bonded to the switching circuit components 11 and 12 with a thermal interface material (TIM) interposed therebetween. The metal plate 43 is, for example, a copper plate with a low thermal resistance.

In the power supply circuit module 106, the metal plate 43 is provided on the surface of the upper-substrate-side resin layer 41. Thus, stress caused by external force and applied to mounted components (switching circuit components 11 and 12 and the like) on the upper substrate 40 can be reduced.

Furthermore, since the metal plate 43 with a low thermal resistance is provided on the surface of the upper-substrate-side resin layer 41, heat dissipation characteristics of the switching circuit components 11 and 12, which are heat generation components, are high, and heat dissipation characteristics of a heat generation component and heat dissipation characteristics of the upper substrate 40 are also high.

Seventh Preferred Embodiment

In a seventh preferred embodiment, a power supply circuit module in which a metal plate for protection and heat dissipation is provided at an upper-substrate-side resin layer, as in the sixth preferred embodiment, will be described as an example.

Figure 20:
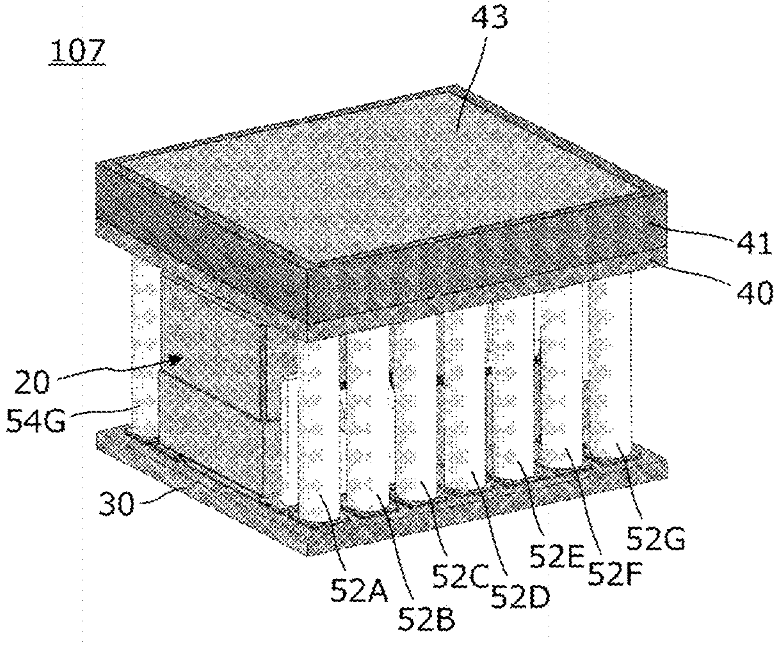
FIG. 20 is a perspective view of a power supply circuit module 107 according to a seventh preferred embodiment of the present invention.
Figure 21:
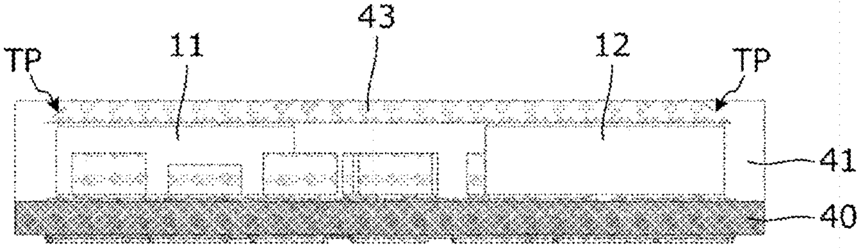
FIG. 21 is a front perspective view of an upper portion of the power supply circuit module 107 illustrated in FIG. 20.

FIG. 20 is a perspective view of a power supply circuit module 107 according to the seventh preferred embodiment. FIG. 21 is a front perspective view of an upper portion of the power supply circuit module 107 illustrated in FIG. 20.

The power supply circuit module 107 includes the lower substrate 30, the upper substrate 40 that is parallel or substantially parallel to the lower substrate 30, the plurality of substrate connecting members 52A to 52G and 54G that connect the lower substrate 30 with the upper substrate 40 electrically and mechanically, and the like.

The lower substrate 30 is a multilayer substrate. Chip components and the inductor element 20 are mounted on the lower substrate 30.

As illustrated in FIG. 21, a plurality of chip components and the switching circuit components 11 and 12 are mounted on the upper substrate 40. Furthermore, the upper-substrate-side resin layer 41 covers the upper surface of the upper substrate 40. The metal plate 43 is provided at the upper-substrate-side resin layer 41 in such a manner that the metal plate 43 is exposed to the outer surface of the upper-substrate-side resin layer 41. The metal plate 43 is bonded to the switching circuit components 11 and 12 with a thermal interface material (TIM) interposed therebetween. The metal plate 43 is, for example, a copper plate with a low thermal resistance.

Unlike the example illustrated in FIG. 19, the metal plate 43 includes tapers TP at edges of the metal plate 43. Each of the tapers is oriented such that protrusion of the metal plate 43 toward the outer surface of the upper-substrate-side resin layer 41 is reduced or prevented. The metal plate 43 and the upper-substrate-side resin layer 41 have different thermal expansion coefficients (linear expansion coefficients). However, because the taper-shaped portions at the edges of the metal plate 43 make the metal plate 43 engaged with the upper-substrate-side resin layer 41, lifting or separation of the metal plate 43 from the upper-substrate-side resin layer 41 is reduced or prevented.

In the power supply circuit module 107, the resistance to stress caused by external force to mounted components (switching circuit components 11 and 12 and the like) on the upper substrate 40 or a difference in thermal expansion coefficient is high.

Furthermore, because heat dissipation characteristics of the switching circuit components 11 and 12, which are heat generation components, are high, the heat dissipation characteristics of a heat generation component and the heat dissipation characteristics of the upper substrate 40 are also high.

Eighth Preferred Embodiment

In an eighth preferred embodiment, a power supply circuit module in which a metal plate for protection and heat dissipation is provided at an upper-substrate-side resin layer, as in the sixth preferred embodiment, will be described as an example.

Figure 22:
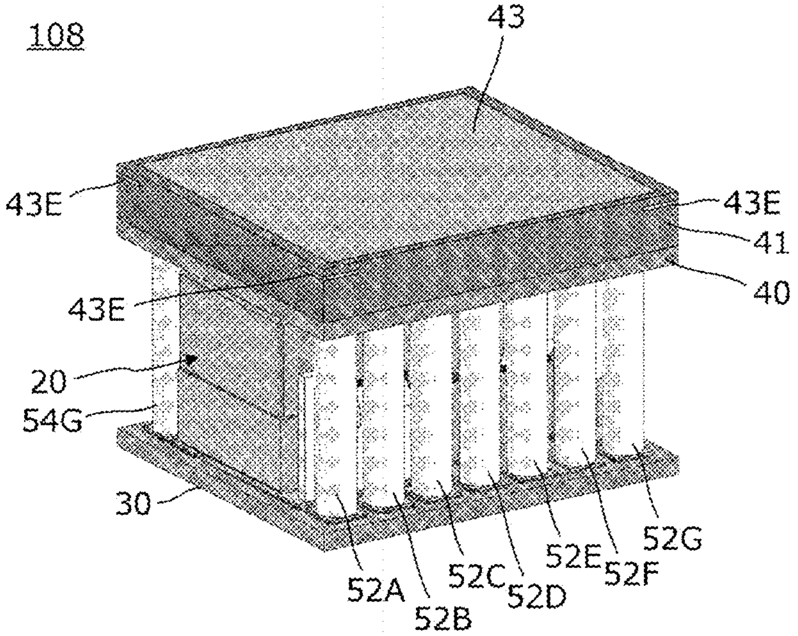
FIG. 22 is a perspective view of a power supply circuit module 108 according to an eighth preferred embodiment of the present invention.
Figure 23:
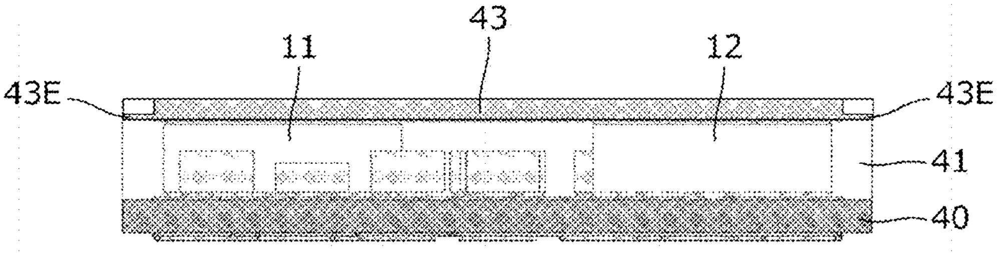
FIG. 23 is a front perspective view of an upper portion of the power supply circuit module 108 illustrated in FIG. 22.

FIG. 22 is a perspective view of a power supply circuit module 108 according to an eighth preferred embodiment. FIG. 23 is a front perspective view of an upper part of the power supply circuit module 108 illustrated in FIG. 22.

The power supply circuit module 108 includes the lower substrate 30, the upper substrate 40 that is parallel or substantially parallel to the lower substrate 30, the plurality of substrate connecting members 52A to 52G and 54G that connect the lower substrate 30 with the upper substrate 40 electrically and mechanically, and the like.

The lower substrate 30 is a multilayer substrate. Chip components and the inductor element 20 are mounted on the lower substrate 30.

As illustrated in FIG. 23, a plurality of chip components and the switching circuit components 11 and 12 are mounted on the upper substrate 40. Furthermore, the upper-substrate-side resin layer 41 covers the upper surface of the upper substrate 40. The metal plate 43 is provided at the upper-substrate-side resin layer 41 in such a manner that the metal plate 43 is exposed to the outer surface of the upper-substrate-side resin layer 41. The metal plate 43 is bonded to the switching circuit components 11 and 12 with a thermal interface material (TIM) interposed therebetween. The metal plate 43 is, for example, a copper plate with a low thermal resistance.

Unlike the example illustrated in FIG. 19, exposure portions 43E, which are portions of edges of the metal plate 43, are exposed to sides of the upper-substrate-side resin layer 41.

Because the exposure portions 43E at the edges of the metal plate 43 make the metal plate 43 engaged with the upper-substrate-side resin layer 41, lifting or separation of the metal plate 43 from the upper-substrate-side resin layer 41 can be reduced or prevented.

The metal plate 43 is provided as a single plate arranged over a plurality of power supply circuit modules. That is, before the plurality of power supply circuit modules that are sequentially arranged vertically and horizontally are separated from each other, the metal plate 43 is a single plate. When the metal plate 43 over the plurality of power supply circuit modules is divided, a power supply circuit module 108 is separated from the plurality of power supply circuit modules. The exposure portions 43E at the edges of the metal plate 43 are portions caused to be exposed by separation of the power supply circuit module 108 from the plurality of power supply circuit modules.

In the power supply circuit module 108, the resistance to stress caused by external force to mounted components (switching circuit components 11 and 12 and the like) on the upper substrate 40 or a difference in thermal expansion coefficient is high.

Furthermore, because the heat dissipation characteristics of the switching circuit components 11 and 12, which are heat generation components, are high, the heat dissipation characteristics of a heat generation component and the heat dissipation characteristics of the upper substrate 40 are also high.

Ninth Preferred Embodiment

In a ninth preferred embodiment, a power supply circuit module characterized in the structure of connection between the drain of a switching element and an electrode on a lower substrate will be described as an example.

Figure 24:
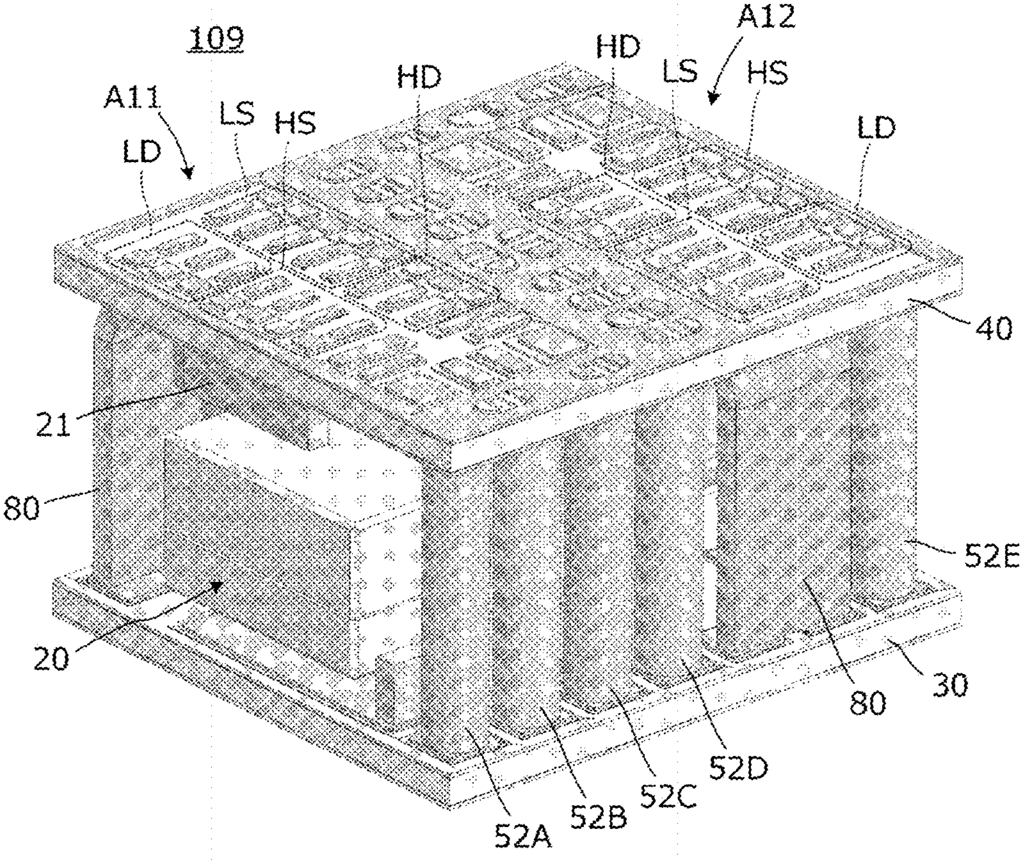
FIG. 24 is a perspective view of a power supply circuit module 109 according to a ninth preferred embodiment of the present invention.

FIG. 24 is a perspective view of a power supply circuit module 109 according to the ninth preferred embodiment. The power supply circuit module 109 includes the lower substrate 30 and the upper substrate 40 that is parallel or substantially parallel to the lower substrate 30.

Figure 25:
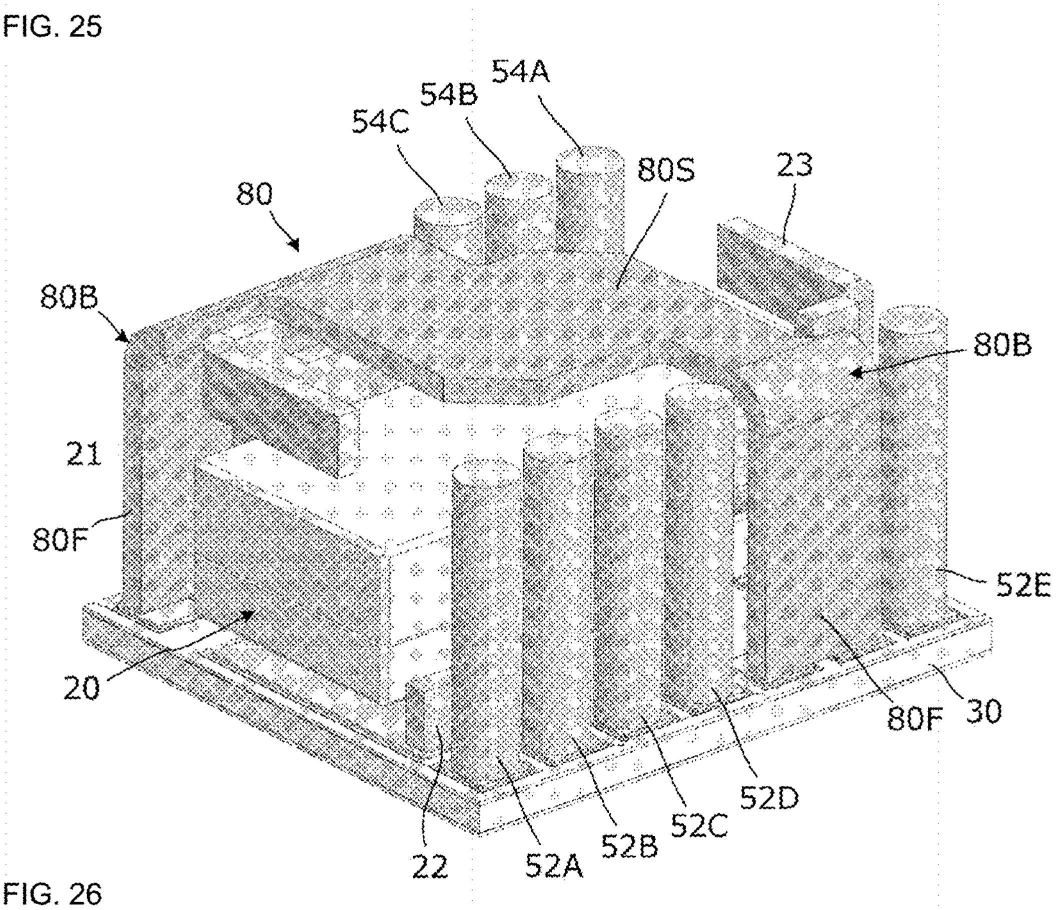
FIG. 25 is a perspective view of a state in which the upper substrate 40 is removed from the state illustrated in FIG. 24.

FIG. 25 is a perspective view of a state in which the upper substrate 40 is removed from the state illustrated in FIG. 24. The power supply circuit module 109 includes the plurality of substrate connecting members 52A to 52E and 54A to 54C that connect the lower substrate 30 with the upper substrate 40 electrically and mechanically, and the like.

Figure 26:
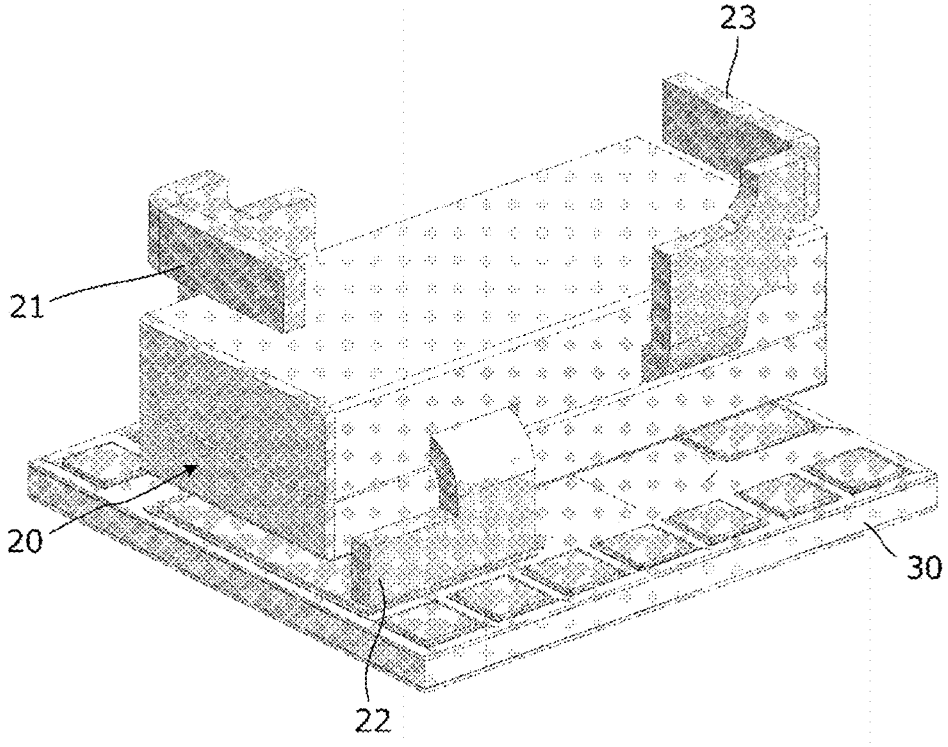
FIG. 26 is a perspective view of a state in which a low-side-source connecting member 80 and substrate connecting members 52A to 52E and 54A to 54C are removed from the state illustrated in FIG. 25.

FIG. 26 is a perspective view of a state in which a low-side-source connecting member 80, which will be described later, and the substrate connecting members 52A to 52E and 54A to 54C are removed from the state illustrated in FIG. 25. The lower substrate 30 is a multilayer substrate. Chip components and the inductor element 20 are mounted on the lower substrate 30.

Figure 27:
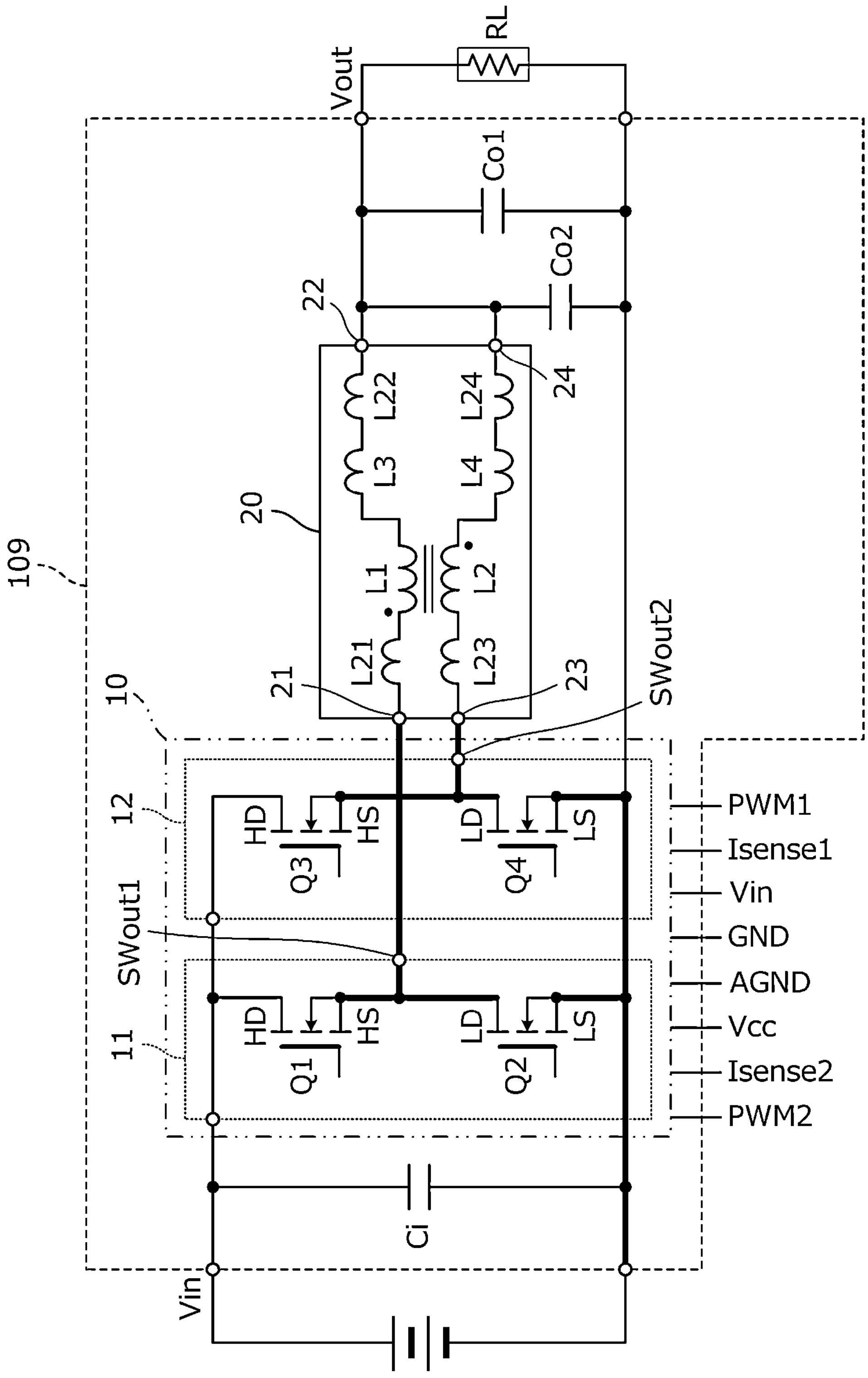
FIG. 27 is a circuit diagram of a power supply circuit formed in the power supply circuit module 109 according to the ninth preferred embodiment of the present invention.

FIG. 27 is a circuit diagram of a power supply circuit in the power supply circuit module 109 according to the ninth preferred embodiment. This power supply circuit is a DC-DC converter including the switching circuit 10, the inductor element 20, and the smoothing capacitors Co1, Co2, and Ci. In this example, the switching circuit 10 includes two step-down converter circuits that are parallel or substantially parallel to each other and includes two pairs of switching circuits including MOS-FETs that are half-bridge connected. The inductor element 20 is connected between the intermediate potential of the half-bridge connection and the load (resistor RL).

The switching circuit 10 includes the switching circuit components 11 and 12. The switching circuit component 11 includes the high-side switching element Q1, the low-side switching element Q2, and a driving circuit that drives the switching element Q1 and the switching element Q2. Similarly, the switching circuit component 12 includes the high-side switching element Q3, the low-side switching element Q4, and a driving circuit that drives the switching element Q3 and the switching element Q4.

As in the power supply circuit module 101 illustrated in FIG. 1, the switching circuit components 11 and 12 and the chip components 42 are mounted on the upper surface of the upper substrate 40. In FIG. 24, a region A11 is a region in which the switching circuit component 11 is mounted, and a region A12 is a region in which the switching circuit component 12 is mounted.

An electrode to which the drain of the low-side switching element Q2 of the switching circuit component 11 is connected is located in a low-side-drain connecting portion LD in the region A11. Similarly, an electrode to which the drain of the low-side switching element Q4 of the switching circuit component 12 is connected is located in a low-side-drain connecting portion LD in the region A12. Furthermore, an electrode to which the source of the low-side switching element Q2 of the switching circuit component 11 is connected is located in a low-side-source connecting portion LS in the region A11. Similarly, an electrode to which the source of the low-side switching element Q4 of the switching circuit component 12 is connected is located in a low-side-source connecting portion LS in the region A12.

An electrode to which the drain of the high-side switching element Q1 of the switching circuit component 11 is connected is located in a high-side-drain connecting portion HD in the region A11. Similarly, an electrode to which the drain of the high-side switching element Q3 of the switching circuit component 12 is connected is located in a high-side-drain connecting portion HD in the region A12. Furthermore, an electrode to which the source of the high-side switching element Q1 of the switching circuit component 11 is connected is located in a high-side-source connecting portion HS in the region A11. Similarly, an electrode to which the source of the high-side switching element Q3 of the switching circuit component 12 is connected is located in a high-side-source connecting portion HS in the region A12.

The low-side-source connecting portion LS, the low-side-drain connecting portion LD, the high-side-source connecting portion HS, and the high-side-drain connecting portion HD mentioned above correspond to LS, LD, HS, and HD, respectively, illustrated in FIG. 27.

As illustrated in FIGS. 24 and 25, the low-side-source connecting member 80 includes a contact surface 80S that is in contact with the rear surface of the upper substrate 40, a leg part 80F that extends toward the lower substrate 30 from the contact surface 80S, and a bent part 80B that is arranged between the contact surface 80S and the leg part 80F. The contact surface 80S, the leg part 80F, and the bent part 80B are integrated together. The low-side-source connecting member 80 is a copper-plate molded body. Since the thickness of the low-side-source connecting member 80 is larger than those of conductive patterns formed at the lower substrate 30 and the upper substrate 40, the low-side-source connecting member 80 has a low resistance compared to resistances of the conductive patterns.

As illustrated in FIGS. 24 and 25, a portion of the low-side-source connecting member 80 is electrically connected to the low-side-source connecting portion LS in the region A11 and the low-side-source connecting portion LS in the region A12 of the upper substrate 40.

As illustrated in FIGS. 24 to 26, the input-side terminal 21 of the inductor element 20 is electrically connected to the low-side-drain connecting portion LD and the high-side-source connecting portion HS in the region A11 of the upper substrate 40. Similarly, the input-side terminal 23 of the inductor element 20 is electrically connected to the low-side-drain connecting portion LD and the high-side-source connecting portion HS in the region A12 of the upper substrate 40.

The circuit configuration itself of the power supply circuit module 109 according to this preferred embodiment is the same as the circuit configuration described in the first preferred embodiment with reference to FIG. 11. In this preferred embodiment, however, the sources of the switching elements Q2 and Q4 are connected to the electrodes of the low-side-source connecting portions LS of the upper substrate 40 illustrated in FIG. 24, and the low-side-source connecting member 80 is connected to a portion nearest to a GND electrode. Thus, a resistance component from the sources of the switching elements Q2 and Q4 to input and output terminal electrodes of GND is low.

Furthermore, in this preferred embodiment, the source of the switching element Q1 and the drain of the switching element Q2 are connected to the input-side terminal 21 of the inductor element 20 with the shortest distance. Thus, a resistance component from the source of the switching element Q1 and the drain of the switching element Q2 to the input-side terminal 21 of the inductor element 20 is small. Similarly, the source of the switching element Q3 and the drain of the switching element Q4 are connected to the input-side terminal 23 of the inductor element 20 with the shortest distance. Thus, a resistance component from the source of the switching element Q3 and the drain of the switching element Q4 to the input-side terminal 23 of the inductor element 20 is small.

In this preferred embodiment, the switching elements Q1 to Q4 are connected to the low-side-source connecting member 80 with the shortest distance. Thus, the resistance of current paths to which the sources of the switching elements Q1 to Q4 are connected is low, and power efficiency decrease caused by the resistance is reduced or prevented.

Figure 28:
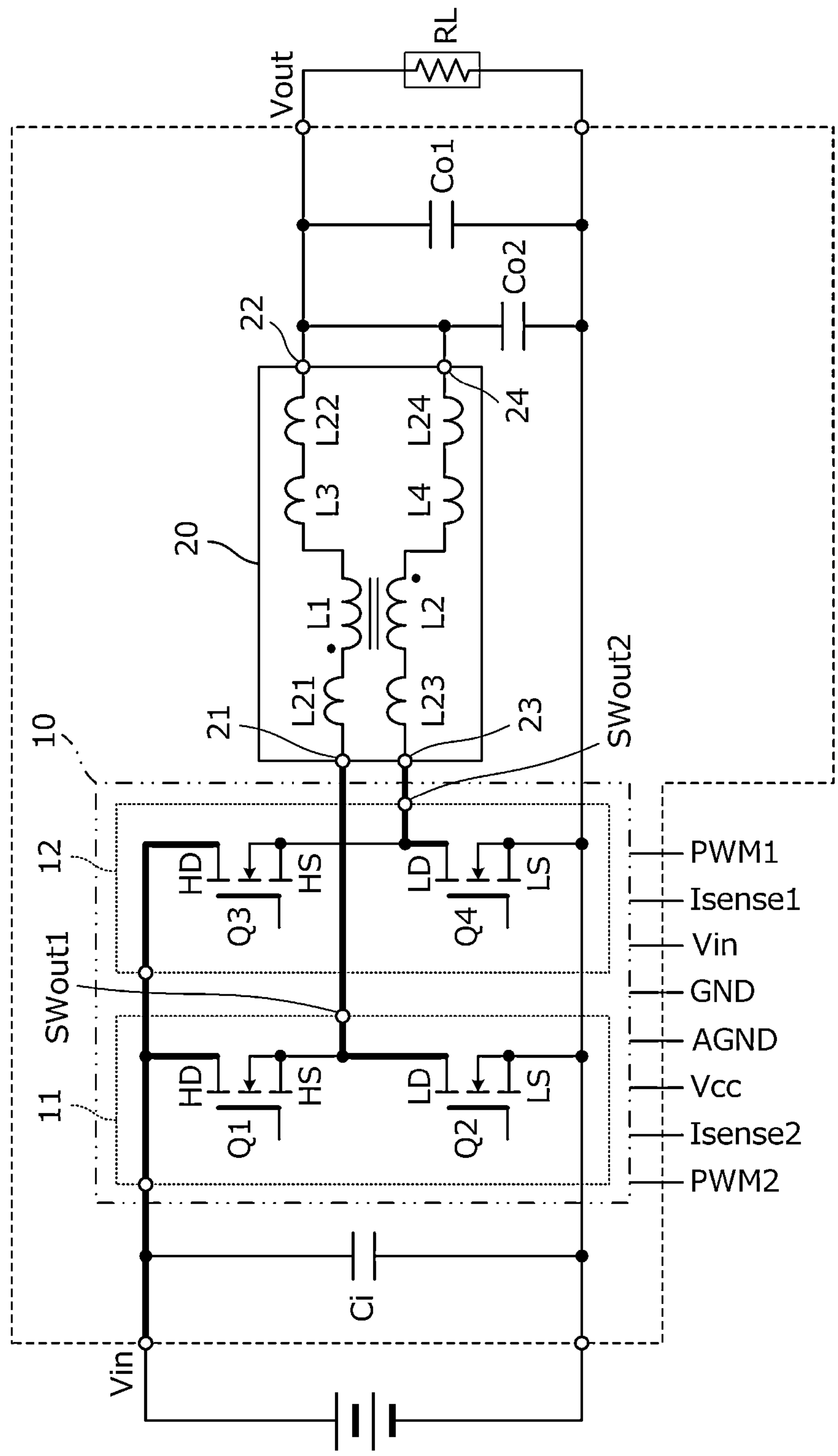
FIG. 28 is a circuit diagram of another power supply circuit in a power supply circuit module according to the ninth preferred embodiment of the present invention.

The example in which the sources of the low-side switching elements Q2 and Q4 are connected to the low-side-source connecting member 80 with the shortest distance has been described above. However, a high-side-drain connecting member similar to the low-side-source connecting member 80 may be provided. FIG. 28 is a circuit diagram illustrating a power supply circuit module for the case where a high-side-drain connecting member similar to the low-side-source connecting member 80 is provided. As described above, the drains of the high-side switching elements Q1 and Q3 may be connected to the high-side-drain connecting member with the shortest distance.

Finally, the present invention is not limited to the preferred embodiments described above. Modifications and changes may be made in an appropriate manner by those skilled in the art. The scope of the present invention is not defined by the preferred embodiments described above but by the scope of the claims. Furthermore, the scope of the present invention includes modifications and changes from preferred embodiments within the scope of the claims and within the scope equivalent to the scope of the claims.

For example, a substrate connecting member does not necessarily have a cylinder shape and may have a prism shape. Furthermore, components on the lower substrate 30 and the upper substrate 40 are not necessarily disposed as described above in the exemplary preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply circuit module comprising:

a power supply circuit including a lower substrate, an upper substrate that is parallel or substantially parallel to the lower substrate, a lower-substrate-side component that is mounted on the lower substrate, an upper-substrate-side component that is mounted on the upper substrate, and a plurality of substrate connectors that connect the lower substrate with the upper substrate electrically and mechanically; wherein a portion of the plurality of substrate connectors is an inductor configuring portion of the power supply circuit or a portion of an inductor configuring portion of the power supply circuit; and the lower-substrate-side component includes an inductor including a terminal at a side of the inductor, and the terminal of the inductor is electrically connected to at least two of the plurality of substrate connectors.

2. The power supply circuit module according to claim 1, further comprising an upper-substrate-side resin layer that is in contact with the upper substrate, seals the upper-substrate-side component, and has a flat upper surface.

3. The power supply circuit module according to claim 2, further comprising:

a metal plate that is exposed to an outer surface of the upper-substrate-side resin layer; wherein an edge of the metal plate has a taper shape that suppresses protrusion toward the outer surface of the upper-substrate-side resin layer.

4. The power supply circuit module according to claim 2, further comprising:

a metal plate that is exposed to an outer surface of the upper-substrate-side resin layer; wherein an edge of the metal plate is exposed to a side portion of the upper-substrate-side resin layer.

5. The power supply circuit module according to claim 1, wherein the plurality of substrate connectors are connected with an insulating resin body interposed therebetween.

6. The power supply circuit module according to claim 1, wherein the plurality of substrate connectors each include an upper surface and a lower surface, and an area of the lower surface of the substrate connector is larger than an area of the upper surface of the substrate connector.

7. The power supply circuit module according to claim 1, wherein the inductor of the lower-substrate-side component has a cuboid shape, and the terminal of the inductor is a portion of the plurality of substrate connectors.

8. The power supply circuit module according to claim 7, wherein a substrate connector that is adjacent to the terminal of the inductor and the terminal are connected with an insulating resin body interposed therebetween.

9. The power supply circuit module according to claim 7, wherein an end portion of the terminal of the inductor has a widened section that is in contact with an electrode on a lower surface of the upper substrate.

10. The power supply circuit module according to claim 7, wherein the upper-substrate-side component includes a switching circuit component including a switch and a driving circuit defining a switching circuit;

the lower-substrate-side component includes a smoothing capacitor; and the power supply circuit is a DC-DC converter that includes the switching circuit, the inductor, and the smoothing capacitor.

11. The power supply circuit module according to claim 10, wherein out of the plurality of substrate connectors, a substrate connector that is adjacent to a terminal of the inductor that is connected to the switching circuit component is connected to a ground of the switching circuit.

12. The power supply circuit module according to claim 10, wherein the terminal of the inductor overlaps with the switching circuit component in plan view of the upper substrate and the lower substrate.

13. The power supply circuit module according to claim 10, further comprising a heat dissipator that is thermally in contact with the switching circuit component.

14. The power supply circuit module according to claim 1, wherein each of the plurality of substrate connectors has a cylinder shape or a prism shape.

15. A power supply circuit module comprising:

a power supply circuit including a lower substrate, an upper substrate that is parallel or substantially parallel to the lower substrate, a lower-substrate-side component that is mounted on the lower substrate, an upper-substrate-side component that is mounted on the upper substrate, and a plurality of substrate connectors that connect the lower substrate with the upper substrate electrically and mechanically; wherein a portion of the plurality of substrate connectors is an inductor configuring portion of the power supply circuit or a portion of an inductor configuring portion of the power supply circuit;

the lower-substrate-side component includes an inductor with a cuboid shape including a terminal at a side of the inductor, and a terminal of the inductor is a portion of the plurality of substrate connectors;

the upper-substrate-side component includes a switching circuit component including a switch and a driving circuit defining a switching circuit;

the lower-substrate-side component includes a smoothing capacitor;

the power supply circuit is a DC-DC converter that includes the switching circuit, the inductor, and the smoothing capacitor;

the switching circuit component includes two switching circuit components;

the inductor includes two inductors that are connected to the two switching circuit components; and the two switching circuit components each include a high-side switch, a low-side switch, and driving circuits.

16. The power supply circuit module according to claim 15, wherein the two switching circuit components are parallel or substantially parallel to each other on the upper substrate, and an upper-substrate-side component other than the two switching circuit components is between the two switching circuit components.

17. The power supply circuit module according to claim 15, wherein the two switching circuit components are parallel or substantially parallel to each other such that positions of an input-side terminal and an output-side terminal are in a 180-degree rotational relationship.

18. The power supply circuit module according to claim 15, wherein the two inductors define a coupled inductor including coils that are magnetically coupled to each other.

19. The power supply circuit module according to claim 18, wherein the coupled inductor includes four terminals including input-side terminals and output-side terminals that are point-symmetrically positioned, and the two switching circuit components are parallel or substantially parallel to each other such that positions of the two switching circuit components are in a 180-degree rotational relationship.

20. The power supply circuit module according to claim 15, further comprising:

a drain connector including a contact surface that is in contact with a rear surface of the upper substrate, a leg portion that extends toward the lower substrate from the contact surface, and a bent portion between the contact surface and the leg portion, the drain connector being made of a metal plate; and a semiconductor switch mounted on the upper substrate; wherein an electrode that is connected to the semiconductor switch is on the upper substrate; and the contact surface is electrically connected to the electrode connected to the semiconductor switch.

21. A power supply circuit module comprising:

a power supply circuit including a lower substrate, an upper substrate that is parallel or substantially parallel to the lower substrate, a lower-substrate-side component that is mounted on the lower substrate, an upper-substrate-side component that is mounted on the upper substrate, and a plurality of substrate connectors that connect the lower substrate with the upper substrate electrically and mechanically; wherein a portion of the plurality of substrate connectors is an inductor configuring portion of the power supply circuit or a portion of an inductor configuring portion of the power supply circuit;

the lower-substrate-side component includes an inductor with a cuboid shape including a terminal at a side of the inductor, and a terminal of the inductor is a portion of the plurality of substrate connectors; and the terminals include a wide section having a plate shape, and include an input terminal and an output terminal that each penetrate the inductor of the lower-substrate-side component.

22. The power supply circuit module according to claim 21, wherein the inductor of the lower-substrate-side component includes a slit, and the input and output terminals pass through the slit.

23. A power supply circuit module comprising:

a power supply circuit including a lower substrate, an upper substrate that is parallel or substantially parallel to the lower substrate, a lower-substrate-side component that is mounted on the lower substrate, an upper-substrate-side component that is mounted on the upper substrate, and a plurality of substrate connectors that connect the lower substrate with the upper substrate electrically and mechanically; wherein a portion of the plurality of substrate connectors is an inductor configuring portion of the power supply circuit or a portion of an inductor configuring portion of the power supply circuit;

the upper-substrate-side component includes two switching circuit components each including a switch and a driving circuit defining a switching circuit;

the inductor includes two inductors that are connected to the two switching circuit components; and the two inductors define a coupled inductor including coils that are magnetically coupled to each other.

* * * * *